US 6,864,532 B2

United States Patent
Aoki et al.

(10) Patent No.: US 6,864,532 B2
(45) Date of Patent: Mar. 8, 2005

(54) SEMICONDUCTOR DEVICE AND METHOD FOR MANUFACTURING THE SAME

(75) Inventors: Takaaki Aoki, Nishikamo-gun (JP); Akira Kuroyanagi, Okazaki (JP); Mikimasa Suzuki, Toyohashi (JP); Takafumi Arakawa, Kariya (JP); Yukio Tsuzuki, Nukata-gun (JP)

(73) Assignee: Denso Corporation, Kariya (JP)

( * ) Notice: Subject to any disclaimer, the term of this patent is extended or adjusted under 35 U.S.C. 154(b) by 223 days.

(21) Appl. No.: 10/175,294

(22) Filed: Jun. 20, 2002

(65) Prior Publication Data

US 2002/0167046 A1 Nov. 14, 2002

Related U.S. Application Data

(63) Continuation-in-part of application No. 09/758,377, filed on Jan. 12, 2001, now Pat. No. 6,469,345.

(30) Foreign Application Priority Data

Jan. 14, 2000 (JP) .......................................... 2000-10154
Jan. 21, 2000 (JP) .......................................... 2000-17817
Jun. 20, 2001 (JP) .......................................... 2001-187127

(51) Int. Cl.$^7$ ...................... H01L 21/336; H01L 29/788
(52) U.S. Cl. ........................................ 257/330; 438/268
(58) Field of Search .............................. 257/244, 330, 257/332, 333, 334, 410, 411, 520, 559; 438/156, 206, 212, 216, 268, 287, 337, 591

(56) References Cited

U.S. PATENT DOCUMENTS 4,693,781 A 9/1987 Leung et al.
4,839,306 A 6/1989 Wakamatsu
4,954,854 A * 9/1990 Dhong et al. ................ 257/332
5,236,861 A 8/1993 Otsu
5,321,289 A 6/1994 Baba et al.

(List continued on next page.)

FOREIGN PATENT DOCUMENTS

| EP | 0684637 | 11/1995 |
|---|---|---|
| JP | A-60-68650 | 4/1985 |
| JP | A-60-158642 | 8/1985 |
| JP | A-6-219759 | 11/1985 |
| JP | A-61-119056 | 6/1986 |

(List continued on next page.)

OTHER PUBLICATIONS

U.S. patent application Ser. No. 09/630,786, Ishikawa, filed Aug. 2, 2000.
U.S. patent application Ser. No. 09/790,888, Soga et al., filed Feb. 23, 2001.
S. J. Fonash, "Damage Effects in Dry Etching", *Solid State Technology*, Apr. 1985, pp. 201–205.

Primary Examiner—Carl Whitehead, Jr.
Assistant Examiner—Jennifer M Dolan
(74) Attorney, Agent, or Firm—Posz & Bethards, PLC

(57) ABSTRACT

A trench-gate type transistor has a gate insulating film formed on an inner wall of a trench. The gate insulating film includes a first portion located on a wall of the trench and a second portion located on upper and bottom portions of the trench. The first portion includes a first oxide film, a nitride film, and a second oxide film. The second portion includes only an oxide film and is thicker than the first portion. Accordingly, electric field concentration on upper and lower corner portions of the trench can be reduced to improve the withstand voltage. In addition, and end of the trench may have an insulation layer that is thicker than the first portion.

10 Claims, 19 Drawing Sheets

U.S. PATENT DOCUMENTS

| | | | |
|---|---|---|---|
| 5,442,214 A | | 8/1995 | Yang |
| 5,723,891 A | * | 3/1998 | Malhi ........................ 257/341 |
| 5,726,088 A | | 3/1998 | Yanagiya et al. |
| 5,795,792 A | * | 8/1998 | Nishihara ................... 438/133 |
| 5,877,527 A | | 3/1999 | Okabe et al. |
| 5,891,807 A | | 4/1999 | Muller et al. |
| 5,915,180 A | * | 6/1999 | Hara et al. ................. 438/270 |
| 6,114,207 A | | 9/2000 | Okabe et al. |
| 6,147,378 A | | 11/2000 | Liu et al. |
| 6,201,278 B1 | | 3/2001 | Gardner et al. |
| 6,278,155 B1 | | 8/2001 | Okabe et al. |
| 6,316,807 B1 | | 11/2001 | Fujishima et al. |
| 6,372,567 B1 | * | 4/2002 | Tews et al. ................. 438/212 |
| 6,404,007 B1 | * | 6/2002 | Mo et al. .................... 257/324 |
| 6,686,625 B2 | * | 2/2004 | Tihanyi ...................... 257/331 |
| 2001/0008291 A1 | | 7/2001 | Aoki et al. |

FOREIGN PATENT DOCUMENTS

| | | |
|---|---|---|
| JP | A-62-73737 | 4/1987 |
| JP | A-62-136065 | 6/1987 |
| JP | A-62-160731 | 7/1987 |
| JP | A-62-185353 | 8/1987 |
| JP | A-62-293661 | 12/1987 |
| JP | A-63-2371 | 1/1988 |
| JP | A-63-115358 | 5/1988 |
| JP | A-63-166230 | 7/1988 |
| JP | A-63-229743 | 9/1988 |
| JP | A-63-229845 | 9/1988 |
| JP | A-63-278338 | 11/1988 |
| JP | A-63-318768 | 12/1988 |
| JP | A-1-196134 | 8/1989 |
| JP | A-1-216538 | 8/1989 |
| JP | A-2-3956 | 1/1990 |
| JP | A-2-54557 | 2/1990 |
| JP | A-2-260424 | 10/1990 |
| JP | A-2-260660 | 10/1990 |
| JP | A-2-271618 | 11/1990 |
| JP | A-2-271619 | 11/1990 |
| JP | A-2-271620 | 11/1990 |
| JP | A-3-147327 | 6/1991 |
| JP | A-3-252131 | 11/1991 |
| JP | A-4-37152 | 2/1992 |
| JP | A-5-55361 | 3/1993 |
| JP | A-5-102297 | 4/1993 |
| JP | A-5-226298 | 9/1993 |
| JP | B2-5-75184 | 10/1993 |
| JP | B2-6-18248 | 3/1994 |
| JP | B2-6-24228 | 3/1994 |
| JP | B2-7-48547 | 5/1995 |
| JP | B2-2519474 | 5/1996 |
| JP | A-8-203863 | 8/1996 |
| JP | B2-2552152 | 8/1996 |
| JP | B2-2589209 | 12/1996 |
| JP | B2-2602808 | 1/1997 |
| JP | B2-2635607 | 4/1997 |
| JP | B2-2647884 | 5/1997 |
| JP | A-9-162168 | 6/1997 |
| JP | B2-2667552 | 6/1997 |
| JP | B2-2671312 | 7/1997 |
| JP | A-9-260663 | 10/1997 |
| JP | A-9-283535 | 10/1997 |
| JP | A-9-307101 | 11/1997 |
| JP | A-9-330928 | 12/1997 |
| JP | A-9-331063 | 12/1997 |
| JP | B2-2794565 | 6/1998 |
| JP | A-10-229119 | 8/1998 |
| JP | A-11-97523 | 4/1999 |
| JP | A-11-102961 | 4/1999 |

* cited by examiner

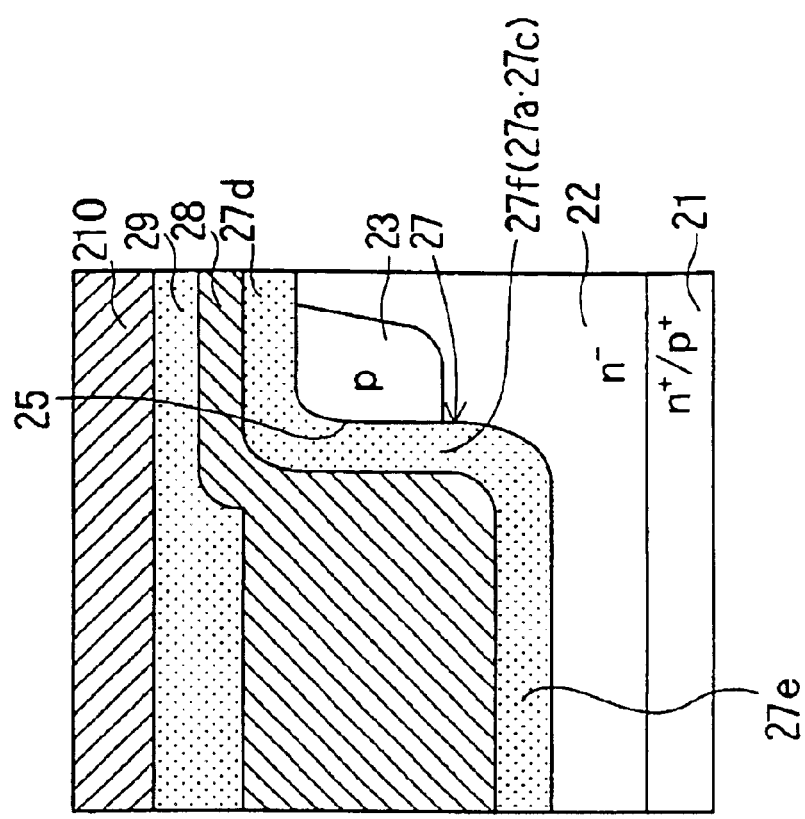
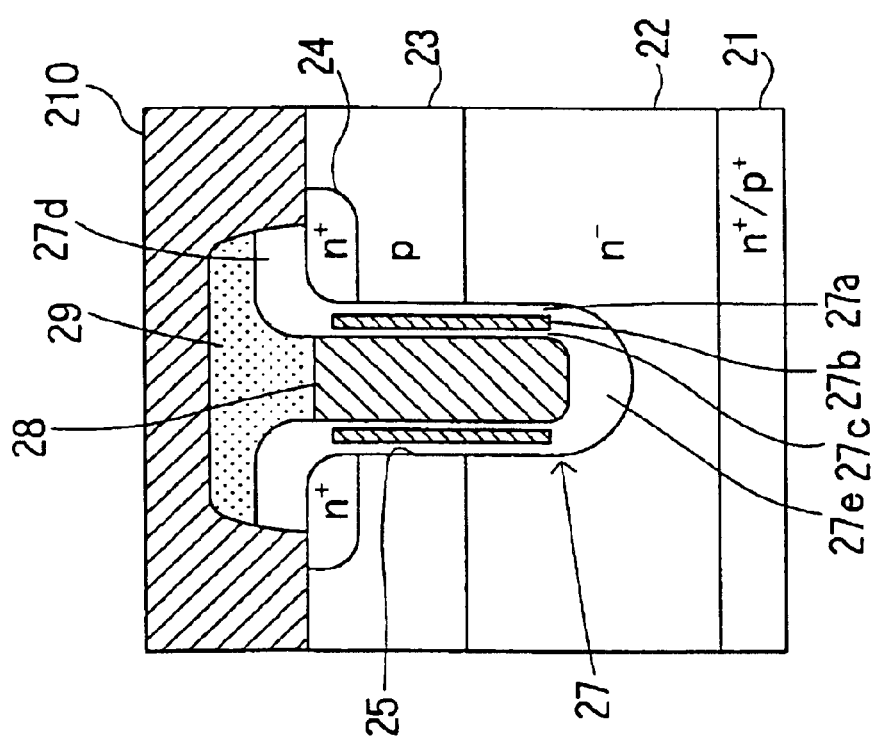
FIG. 15A
FIG. 15B

SEMICONDUCTOR DEVICE AND METHOD FOR MANUFACTURING THE SAME

CROSS REFERENCE TO RELATED APPLICATIONS

This application is a continuation-in-part of U.S. patent application Ser. No. 09/758,377, which was filed on Jan. 12, 2001 now U.S. Pat. No. 6,469,345.

The contents of the parent application, U.S. patent application Ser. No. 09/758,377, are incorporated herein by reference. Also, this application is based upon and claims the benefit of Japanese Patent Applications No.2001-187127, the contents of which are incorporated herein by reference.

BACKGROUND OF THE INVENTION

This invention relates to a semiconductor device, in which a trench is formed in a semiconductor substrate with a layered film formed on an inner wall of the trench, and to a method for manufacturing the same.

U.S. Pat. No. 5,321,289 (which corresponds to Japanese unexamined patent publication JP-A-6-132539) discloses such a transistor, as shown in FIG. 20, having a trench-gate structure in which a trench is formed on a semiconductor substrate and a gate insulating film composed of an oxide film and a nitride film is formed on an inner wall of the trench. Because the gate insulating film is composed of a compound film of the oxide film and the nitride film, the device can provide a higher gate withstand voltage and a lower on-voltage than a device in which the gate insulating film is composed of only an oxide film.

As a result of studies of the semiconductor device described above, however, it was found that electric field tends to concentrate on corner portions of the upper and bottom portions of the trench, which lowers the withstand voltage. Further, the gate insulating film composed of the oxide film and the nitride film has many interface states. In this connection, it was further found that a threshold voltage was liable to vary due to effects of the interface states at a transistor operation state. This can lower the reliability of the device.

SUMMARY OF THE INVENTION

The present invention has been made in view of the above problems. An object of the present invention is to attain a high withstand voltage in a semiconductor device having a trench-gate structure and simultaneously to prevent a decrease in withstand voltage by relaxing electric field concentration at upper and bottom portions of a trench. Another object of the present invention is to suppress variations in threshold voltage while keeping the high withstand voltage in the semiconductor device.

According to the present invention, briefly, an insulating film disposed on an inner wall of a trench has a first portion and a second portion. The first portion is composed of a first oxide film, a nitride film, and a second oxide film, and the second portion is composed of only an oxide film. Further, one of the first portion and the second portion of the insulating film is disposed on a side wall of the trench, and another one of the first portion and the second portion of the insulating film is disposed on at least one of an upper portion and a bottom portion of the trench.

Specifically, when the first portion is disposed on the side wall portion of the trench, the second portion is disposed on at least one of the upper portion and the bottom portion of the trench. Accordingly, electric filed concentration on the one of the upper portion and the bottom portion can be mitigated, and a high withstand voltage can be attained.

The first portion may be disposed only on the bottom portion of the trench. In this case, the second portion is disposed on the side wall portion of the trench. Accordingly, variations in threshold voltage can be suppressed while keeping a high withstand voltage.

In another aspect, in a semiconductor device of the present invention, a gate-insulating film is thicker at a longitudinal end of a trench, which is formed in a surface of a semiconductor substrate, than the rest of the trench to provide higher breakdown voltage without increasing ON voltage. A heavily doped region, which is heavily doped with an impurity, is formed in a trench surface, which defines the trench, at the longitudinal end. A silicon oxide film, which is formed on the trench surface, is thicker at the longitudinal end than the rest of the silicon oxide film because the heavily doped region is oxidized faster. Therefore, the gate-insulating film is thicker at the longitudinal end. Alternatively, the trench surface is oxidized after removing the silicon nitride film, which reduces oxidization speed of silicon, at the longitudinal end. Thus, the silicon oxide film is thicker at the longitudinal end.

A semiconductor device in the present invention includes a source region, which is located in the surface of the semiconductor substrate and includes a first region and a second region. The first region has a predetermined impurity concentration and a predetermined depth from the surface of the substrate. The second region has an impurity concentration lower than the first region and a depth larger than the first region. The second region is located at an entrance of the trench to separate the first region and a channel region, so a thickness of the gate-insulating film on the channel region is not affected by a thick silicon oxide film formed on the first region. Thus, the semiconductor device in the present invention has stable threshold voltage.

BRIEF DESCRIPTION OF THE DRAWINGS

Other objects and features of the present invention will become more readily apparent from a better understanding of the preferred embodiments described below with reference to the following drawings, in which;

FIG. 15A is a cross-sectional view of a semiconductor device according to the fourth embodiment of the present invention;

FIG. 15B is a partial cross-sectional view of a fourth embodiment seen from a direction perpendicular to the view direction of FIG. 15A;

DETAILED DESCRIPTION OF THE PREFERRED EMBODIMENTS

First Embodiment

A semiconductor device according to a first preferred embodiment is explained with reference to FIG. 1, which has a transistor such as a power MOSFET, an IGBT, or the like having a trench-gate structure.

Figure 1:
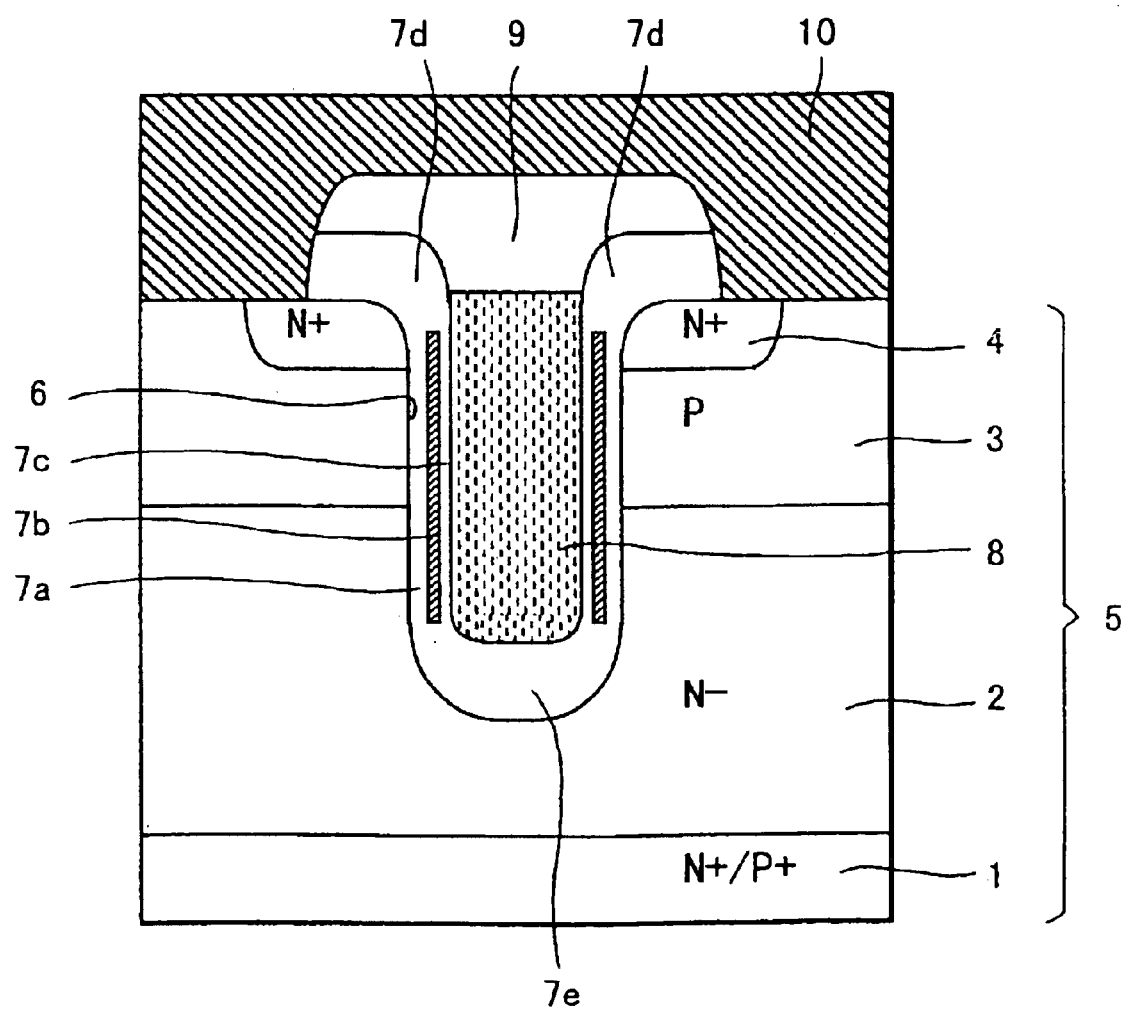
FIG. 1 is a cross-sectional view showing a semiconductor device in a first preferred embodiment of the invention.

In FIG. 1, an n-type drift layer 2 is formed on a $p^+$ or $n^+$-type silicon substrate 1, and a p-type layer 3 is formed thereon as a base region. An $n^+$-type layer 4 is formed in the p-type layer 3 to form a source region. A semiconductor substrate 5 is composed of these parts. On a main surface of the semiconductor substrate 5, a trench 6 is formed and penetrates the $n^+$-type layer 4 and the p-type layer 3 to reach the drift layer 2. A gate insulating film is formed on an inner wall of the trench 6.

The gate insulating film is a layered film that is formed on the side wall portion of the trench 6 and a silicon oxide film 7d formed on the upper and lower portions of the trench 6. The layered film is composed of a silicon oxide film (first oxide film) 7a, a silicon nitride film 7b, and a silicon oxide film (second oxide film) 7c. The silicon nitride film 7b is positioned with an upper edge that is positioned at an upper portion than the boundary between the p-type layer 3 and the $n^+$-type layer 4, i.e., on the main surface side of the semiconductor substrate 5. The silicon oxide films 7d, 7e formed on the upper portion and the bottom portion of the trench 6 respectively have thicknesses thicker than that of the layered film formed on the side wall portion of the trench 6. Here, the upper portion of the trench 6 is that part including the upper side corner portion of the trench 6, while the bottom portion of the trench 6 is that part including the bottom side corner portion of the trench 6.

In the trench 6, a gate electrode 8 is formed from doped polycrystalline silicon. A BPSG film 9 is formed on the surfaces (substrate main surface) of the p-type layer 3 as the base region and the $n^+$-type layer 4 as the source region, and a source electrode 10 and a metallic film for gate and collector electrodes (not shown in FIG. 1) are formed to be connected through contact holes formed in the BPSG film 9.

The constitution described above can provide a transistor having a gate-trench structure in which the insulating films formed on the inner wall of the trench 6 collectively form a gate insulating film, and the region of the side wall portion of the trench 6 in the p-type layer 3 functions as a channel region.

Here, as the gate insulating film, the layered film composed of the silicon oxide film 7a, the silicon nitride film 7b, and the silicon oxide film 7c is formed on the side wall portion of the trench 6. This structure can provide a high withstand voltage as in a conventional one. In addition, because the silicon oxide films 7d, 7e formed on the upper and bottom portions of the trench 6 have thicknesses thicker than that of the layered film on the side wall portion of the trench 6, electric field concentration is mitigated on the upper and lower corner portions of the trench 6, thereby preventing the decrease in withstand voltage at that portions.

Next, a method for manufacturing the semiconductor device described above is explained with reference to FIGS. 2A to 2H.

Figure 2A:
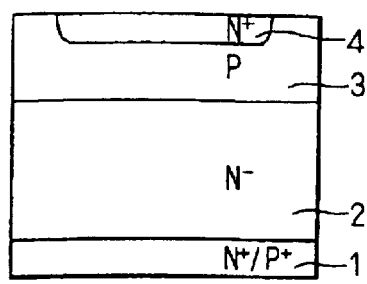
FIGS. 2A to 2H are cross-sectional views showing steps of a method for manufacturing the semiconductor device shown in FIG. 1.

First, in a step shown in FIG. 2A, the $n^-$-type drift layer 2 is formed on the $P^+$-type or $n^+$-type silicon substrate 1. Then, the p-type layer 3 and the $n^+$-type layer 4 as the source region are sequentially formed by ion-implantation and thermal diffusion. The depth of the p-type layer 3 is about 2 to 3 $\mu$m, and the depth of the $n^+$-type layer 4 is about 0.5 $\mu$m.

Figure 2B:
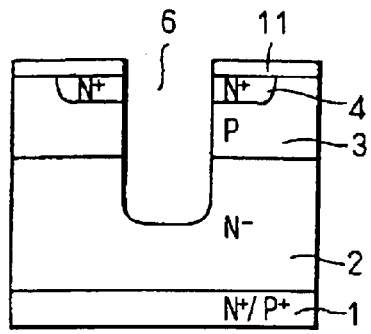

In a step shown in FIG. 2B, a silicon oxide film 11 is deposited by a CVD method as a trench mask with a thickness of about 0.5 μm, and patterning is performed thereto by photo-lithography and anisotropic dry etching. Then, the trench 6 is formed to penetrate the n⁺-type layer 4 and the p-type layer 3 and to reach the drift layer 2 by anisotropic dry etching using the patterned silicon oxide film 11 as a mask. The depth of the trench 6 is about 4 to 6 μm.

Figure 2C:
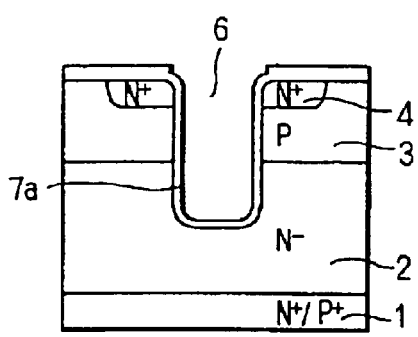

Subsequently, in a step shown in FIG. 2C, silicon exposed in the trench 6 is isotropically etched and removed at a depth of about 0.1 μm by chemical dry etching using $CF_4$ and $O_2$ gases. Then, a sacrifice oxide film of about 100 nm is formed by thermal oxidation in $H_2O$ or $O_2$ atmosphere. After that, the sacrifice oxide film is removed by wet etching using dilute hydrofluoric acid. At that time, the oxide film 11 as the trench mask is simultaneously etched. The time period for the wet etching can be set at either of a time period for removing only the sacrifice oxide film and a time period for removing both the sacrifice oxide film and the silicon oxide film 11. After that, the silicon oxide film 7a is formed to have a thickness of about 100 nm by thermal oxidation performed in $H_2O$ or $O_2$ atmosphere.

Figure 2D:
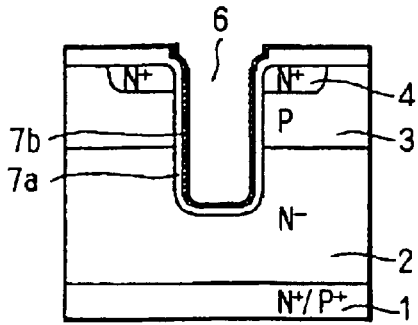

Next, in a step shown in FIG. 2D, the silicon nitride film 7b is formed to have a thickness of about 10 to 30 nm by an LPCVD method.

Figure 2E:
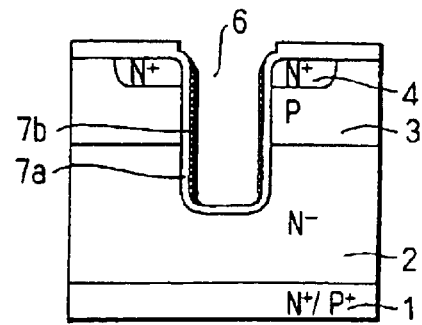

In a step shown in FIG. 2E, the part of the silicon nitride film 7b disposed on the bottom portion of the trench 6 is removed by anisotropic dry etching using gas including $CHF_3$ and $O_2$ while remaining the silicon nitride film 7b on the side wall portion of the trench 6, so that the silicon oxide film 7a is exposed. At that time, that parts of the silicon nitride film 7b formed on the upper portion of the trench 6 and on the silicon oxide film 11 on the substrate surface are removed simultaneously, and the silicon oxide film 7a is exposed at that regions.

Figure 2F:
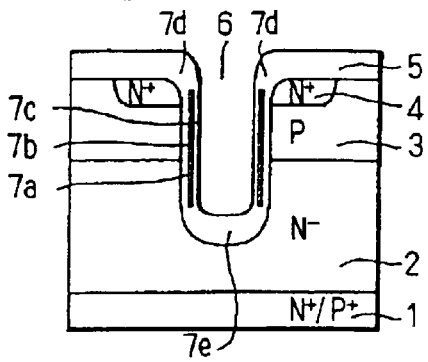

In a step shown in FIG. 2F, for example, thermal oxidation is carried out in $H_2O$ or $O_2$ atmosphere at preferably 850 to 1050° C., and accordingly, the silicon oxide film 7c of about 5 to 10 nm is formed on the silicon nitride film 7b. At that time, the silicon oxide films 7d, 7e are formed on the upper and lower portions of the trench 6, where the silicon nitride film is removed, to have a thickness of about 180 to 330 nm respectively that is increased due to thermal oxidation.

In this case, because the silicon nitride film 7b is thin with a thickness of about 10 to 30 nm, the silicon oxide film can be grown on the upper portion of the trench 6 in a lateral direction after the silicon nitride film 7b is partially etched. Therefore, the thickness of the silicon oxide film can be increased not only on the surface of the silicon substrate but also at the opening portion of the trench 6. That is, the thickness of the silicon oxide film can be increased as well at the corner portion of the trench 6.

Figure 2G:
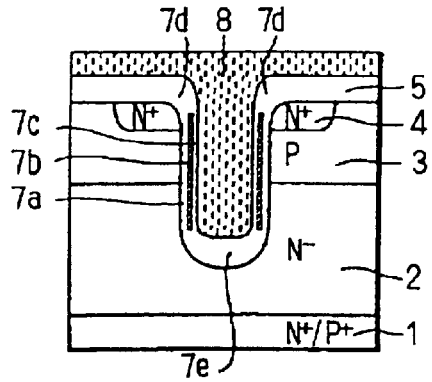
Figure 2H:
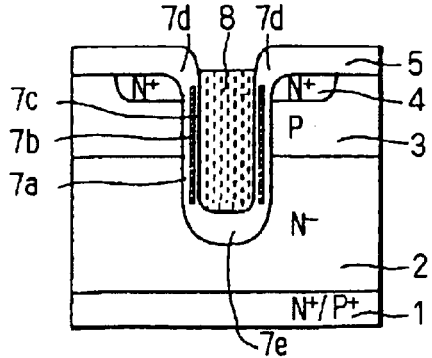

Subsequently, in a step shown in FIG. 2G, doped polycrystalline silicon 8 for the gate electrode 8 is formed by the LPCVD method, thereby filling inside the trench 6. Successively, the polycrystalline silicon 8 is etched-back to have a desired thickness. In a step shown in FIG. 2H, then, the polycrystalline silicon 8 is patterned by photo-lithography to form the gate electrode 8.

After that, as shown in FIG. 1, the BPSG film 9, as an intermediate insulating film, is formed by a plasma enhanced CVD method. The contact holes are formed in the BPSG film 9 by photo-lithography and anisotropic dry etching, and the metallic films for the source, gate and collector electrodes are formed by a sputtering method.

Thus, the semiconductor device shown in FIG. 1 is manufactured. In the method described above, an IGBT is exemplified as the semiconductor device; however, dimensions of the respective parts can be changed appropriately. For example, when a power MOSFET (DMOS) is manufactured as the semiconductor device, preferably, the depth of the trench 6 is about 2 μm, the depth of the p-type layer (p well) 3 is about 1.5 μm, the depth of the n⁺-type layer 4 is about 0.5 μm, and the thickness of the silicon oxide film 7a is about 50 nm.

According to the manufacturing method described above, after the silicon oxide film 7a and the silicon nitride film 7b are formed on the inner wall of the trench 6, the silicon nitride film 7b on the upper and bottom portions of the trench 6 is removed and then thermal oxidation is performed. By performing this thermal oxidation, the silicon oxide film 7c is formed on the silicon nitride film 7b and simultaneously, the silicon oxide films 7d, 7e having large thicknesses are formed on the upper and bottom portions of the trench 6 where the silicon nitride film are removed.

Figure 3A:
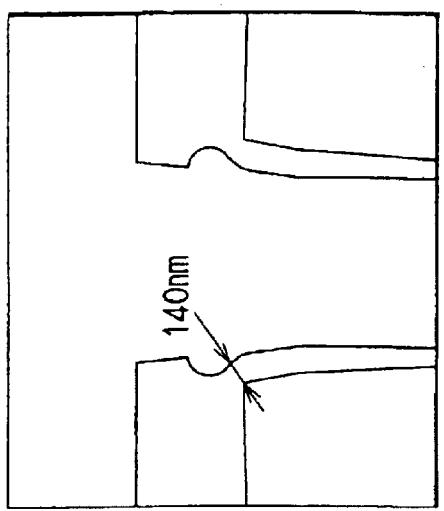
FIGS. 3A and 3B are cross-sectional views schematically showing states of upper and bottom portions of a trench, respectively, formed by the method shown in FIGS. 2A to 2H.
Figure 3B:
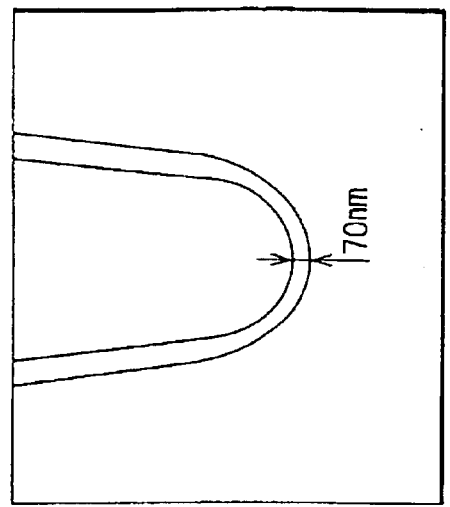
Figure 3C:
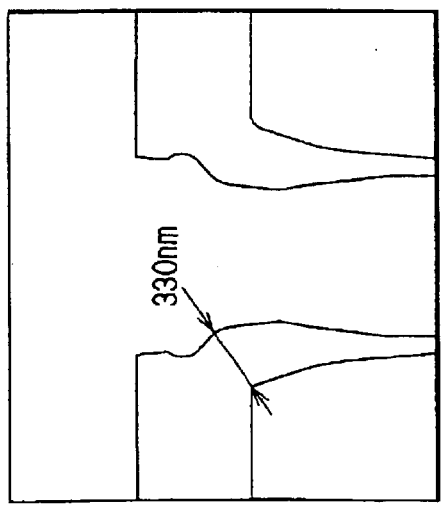
FIGS. 3C and 3D are cross-sectional views showing states of upper and bottom portions of a trench, respectively, formed by a conventional method, for comparison.
Figure 3D:
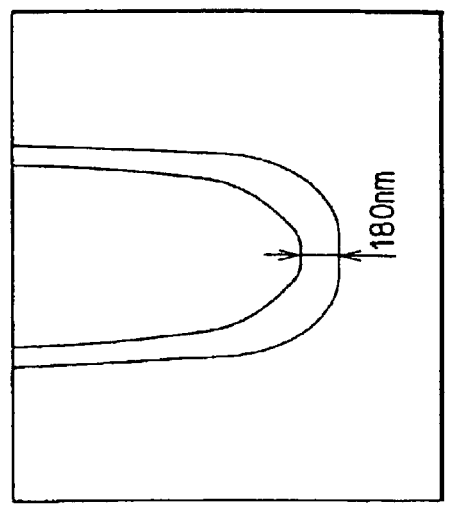

FIGS. 3A and 3B respectively show portions of the gate insulating film on the upper and lower portions of the trench manufactured by the method described above, and illustrations of FIGS. 3A and 3B correspond to practical cross-sectional photographs. Also FIGS. 3C and 3D show portions of the gate insulating film on the upper and lower portions of the trench manufactured by a conventional method in which no removal of the silicon nitride film is performed, and illustrations of FIGS. 3C and 3D correspond to practical cross-sectional photographs. Incidentally, the difference between the examples shown in FIGS. 3A, 3B and FIGS. 3C and 3D is only whether the removal of the silicon nitride film is performed, and the other manufacturing conditions are substantially identical.

When the gate insulating film is formed by the conventional method, the upper and lower portions of the trench have a layered film as the gate insulating film. As shown in FIG. 3C, the thickness on the upper portion of the trench is 140 nm, while as shown in FIG. 3D, the thickness on the bottom portion is 70 nm.

To the contrary, when the gate insulating film is formed by the method according to the present embodiment described above, only the silicon oxide film exists on the upper and bottom portions of the trench. As shown in FIG. 3A, the thickness on the upper portion of the trench is 330 nm while, as shown in FIG. 3B, the thickness on the bottom portion of the trench is 180 nm.

Therefore, when the silicon nitride film on the upper and bottom portions of the trench is removed and the thermal oxidation is carried out as in the present embodiment, the electric field concentration at the corner portions of the upper and bottom portions of the trench can be reduced, and a decrease in the withstand voltage at those locations can be prevented. Further, because the thickness of the silicon oxide film is thick at the upper and bottom portions of the trench 6, the gate input capacity can be reduced.

Figure 4:
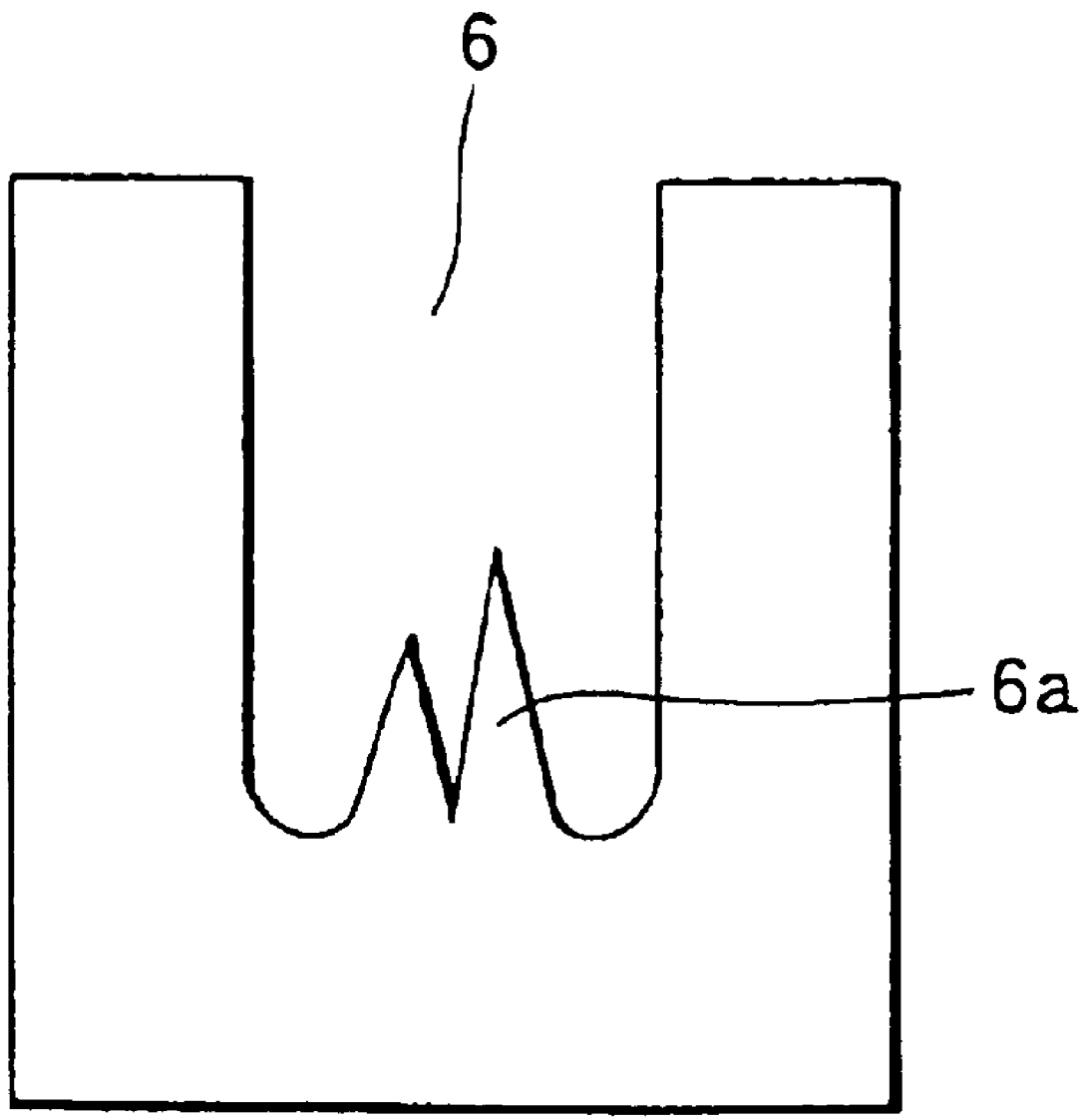
FIG. 4 is a schematic diagram illustrating silicon residues (black-Si) that can be produced at the bottom portion of the trench.

Incidentally, when the trench is formed by trench etching, as shown in FIG. 4, there is a case where silicon residues (black silicon) 6a are produced during the formation of the trench 6. When the gate insulating film is formed at the region having such columnar silicon residues 6a, electric field can locally concentrate on that portion to decrease the gate withstand voltage. Especially in power semiconductor elements such as a power MOS and an IGBT, since the gate region has a large area in a range of several dozens of square millimeters to several hundreds of square millimeters, the probability of adverse effects of the silicon residues is large.

Figure 5A:
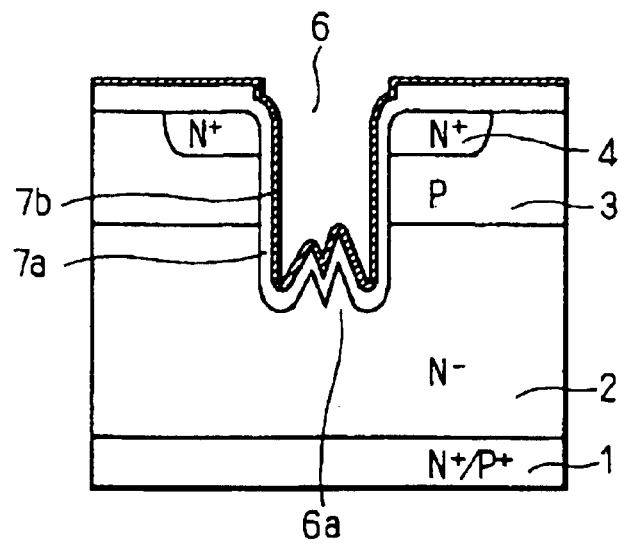
FIGS. 5A to 5C are schematic diagrams illustrating suppression of the effects of silicon residues by the method shown in FIGS. 2A to 2H.
Figure 5B:
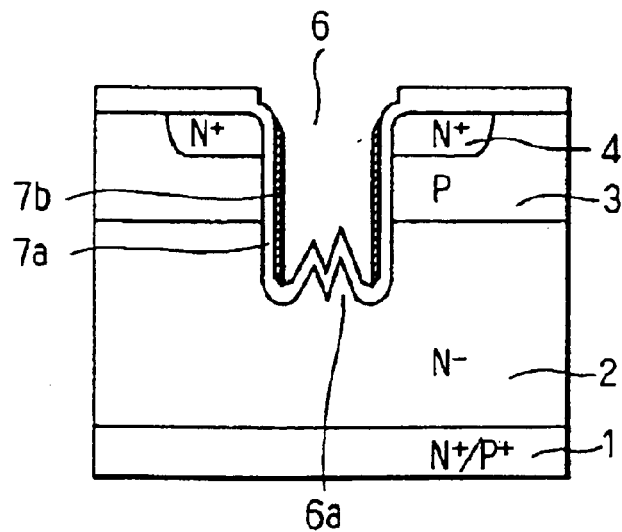

In contrast, according to the manufacturing method described above, the adverse effects of the silicon residues can be eliminated. Specifically, in the case where columnar silicon residues 6a are produced on the bottom portions of the trench 6, if the silicon oxide film is formed as in the conventional way, the effects of the silicon residues appear. However, in the present embodiment, even if silicon residues 6a are produced as shown in FIG. 5A, since the portions of the silicon nitride film 7b extending on the upper and bottom portions of the trench 6 are removed in the step shown in FIG. 2E, the state shown in FIG. 5B is provided.

Figure 5C:
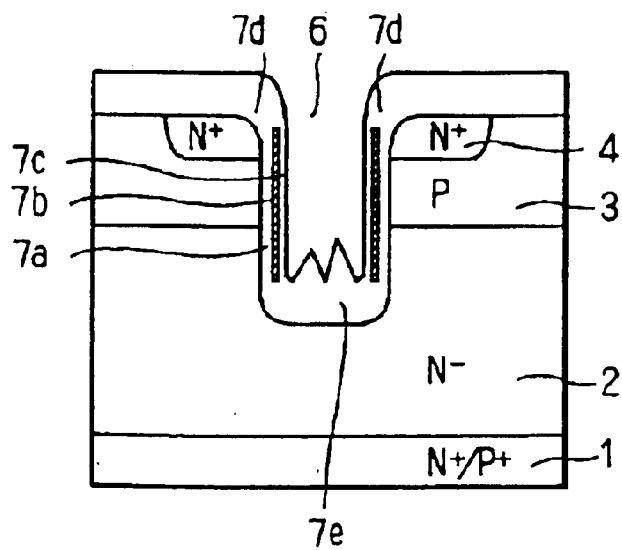

Further, because the thermal oxidation is performed in the step shown in FIG. 2F, the thick silicon oxide film 7e is formed on the bottom portion of the trench 6 to cover the entire region having the silicon residues 6a, and the state as shown in FIG. 5C is provided. Accordingly, the decrease in gate withstand voltage is suppressed at the bottom portion of the trench 6 and a high gate voltage yield can be attained.

Figure 6:
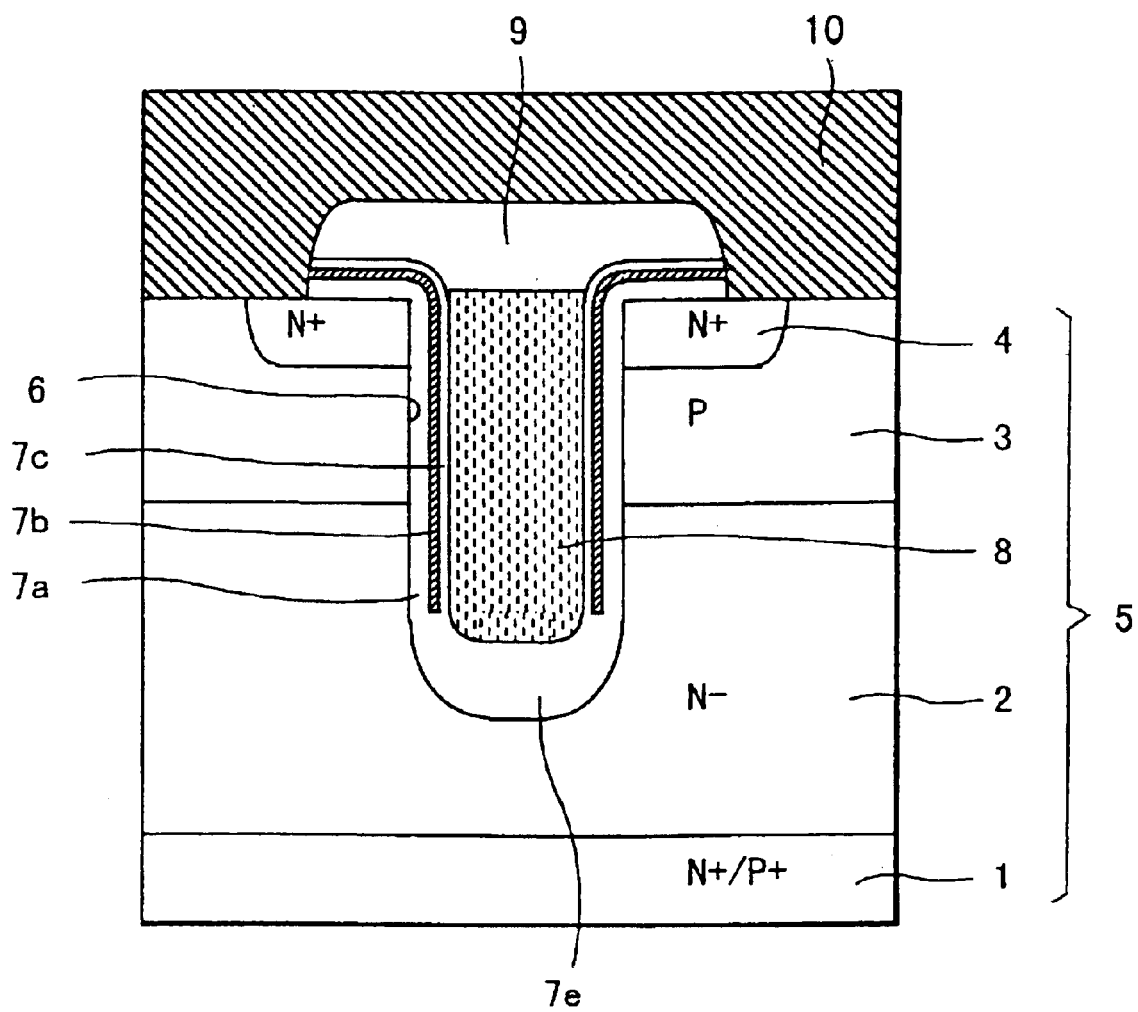
FIG. 6 is a cross-sectional view showing a semiconductor device, which is a modification of the embodiment of FIG. 1.
Figure 7:
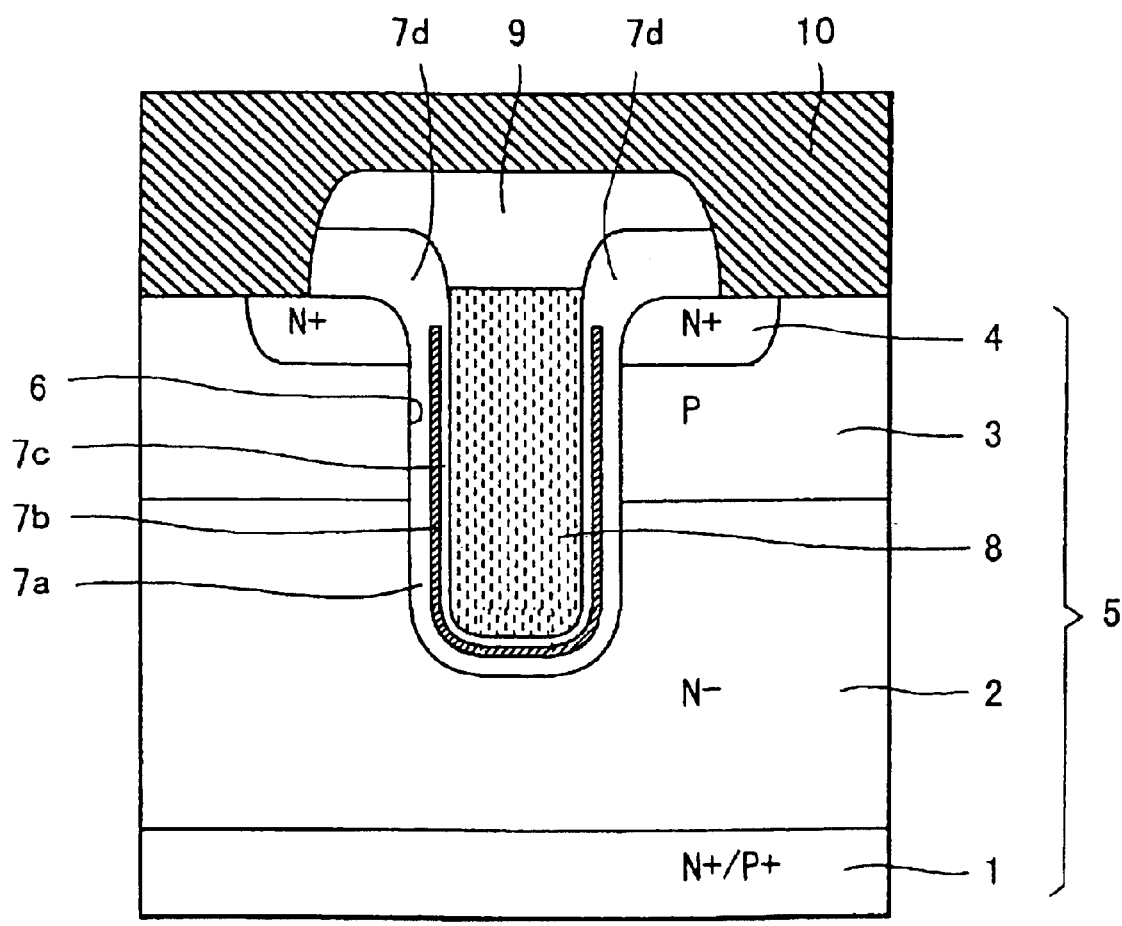
FIG. 7 is a cross-sectional view showing a semiconductor device, which is another modification of the embodiment of FIG. 1.

Incidentally, in the embodiment described above, the gate withstand voltage is improved by forming the insulating film on both the upper and bottom portions of the trench 6 only from the silicon oxide film; however, as shown in FIGS. 6 and 7, this countermeasure may be applied to only one of the upper and bottom portions of the trench 6, and the gate withstand voltage at another one thereof may be increased by another countermeasure. To form the single silicon oxide film at only one of the upper and bottom portions of the trench 6, for example, the portion of the silicon nitride film on another one of the upper and bottom portions is masked not to be removed during the dry-etching.

In the embodiment described above, the transistor having a trench-gate structure is exemplified as a semiconductor device; however, the withstand voltage can be increased even in other semiconductor devices such as a semiconductor device having a trench-type capacitor and a semiconductor device having an element isolation structure, by forming the insulating film on the inner wall of the trench, from the layered film of the oxide film and the nitride film on the side wall portion, and only from the oxide film on the upper portion and/or the -bottom portion of the trench. The conductive type of each layer in the semiconductor device is not limited to that shown in FIG. 1, and may be inverted from that shown.

Second Embodiment

Figure 8:
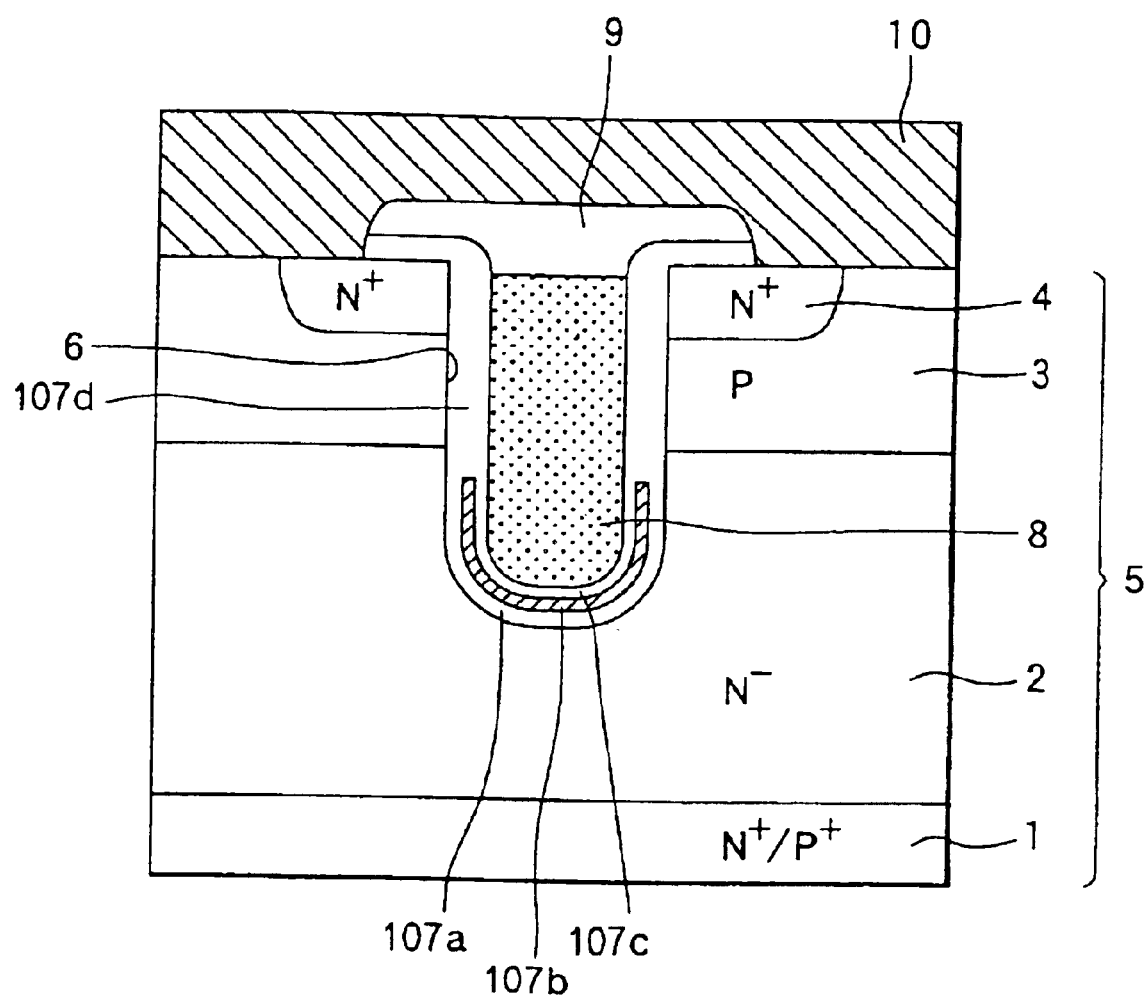
FIG. 8 is a cross-sectional view showing a semiconductor device in a second preferred embodiment of the invention.

A semiconductor device according to a second preferred embodiment is explained with reference to FIGS. 8 to 10, in which the structure of a gate insulating film is different from that in the first embodiment, and the differences are explained below. The same parts as those in the first embodiment are indicated by the same reference numerals.

The gate insulating film in the second embodiment is composed of a layered film formed on the bottom portion of the trench 6 and a silicon oxide film 107d formed on the side wall portion and the upper portion of the trench 6. The layered film is composed of a silicon oxide film 107a, a silicon nitride film 107b and a silicon oxide film 107c. The silicon nitride film 107b has an upper end that is provided at a position lower than that of the boundary between the p-type layer 3 and the drift layer 2, i.e. at a back surface side of the semiconductor substrate 5.

Thus, in this embodiment, because the layered film composed of the silicon oxide film 107a, the silicon nitride film 107b, and the silicon oxide film 107c is formed on the bottom portion of the trench 6, a high withstand voltage can be attained as in a conventional one. Further, because the oxide film 7d formed on the side wall portion of the trench 6 is composed of only a silicon oxide film, variation in threshold voltage can be suppressed. As a result, the variation in threshold voltage can be decreased while maintaining a high gate withstand voltage.

Next, a manufacturing method of the semiconductor device described above is explained with reference to FIGS. 9A to 9H and 10A to 10D. Here, the steps shown in FIGS. 9A to 9D are substantially the same as those shown in FIGS. 2A to 2D, and therefore, the explanation is started from a step shown in FIG. 9E. Incidentally, the silicon oxide film 7a in FIG. 2C corresponds to the silicon oxide film 107a in FIG. 9C, and the silicon nitride film 7b in FIG. 2D corresponds to the silicon nitride film 107b in FIG. 9D.

Figure 9A:
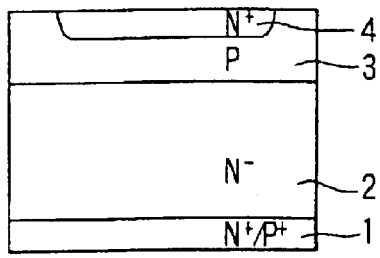
FIGS. 9A to 9H, and 10A to 10D are cross-sectional views showing steps of a method for manufacturing the semiconductor device shown in FIG. 8.
Figure 9E:
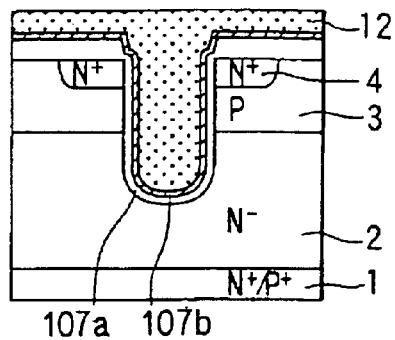
Figure 9B:
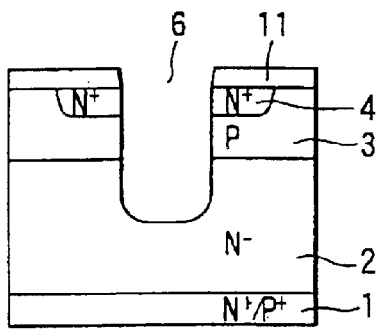

Then, in the second embodiment, in the step shown in FIG. 9E, photo-resist 12 is embedded inside the trench 6 by a rotation coating method. It should be noted that the trench 6 may be filled with a material other than the photo-resist, such as poly silicon, provided that the material can serve as an etching stopper with respect to the silicon nitride film.

Figure 9F:
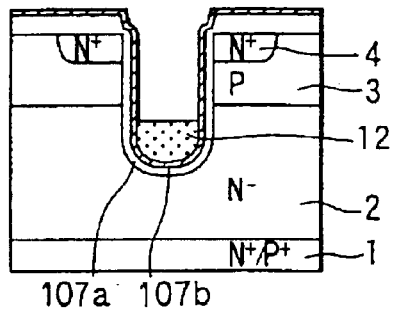
Figure 9C:
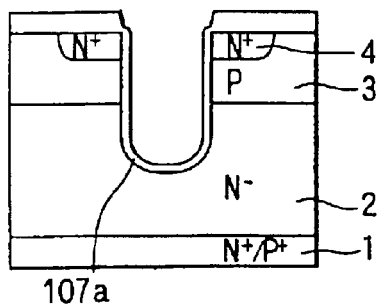

In a step shown in FIG. 9F, the photo-resist 12 is partially removed by anisotropic etch-back that is performed under conditions involving a selective ratio between the photo-resist and the silicon nitride film, and accordingly, the photo-resist 12 remains only on the bottom portion of the trench 6.

Figure 9G:
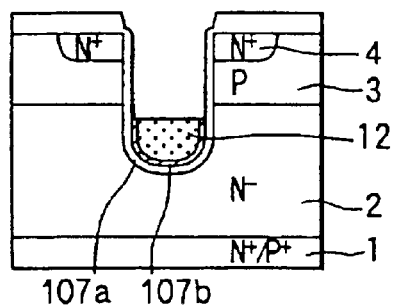
Figure 9D:
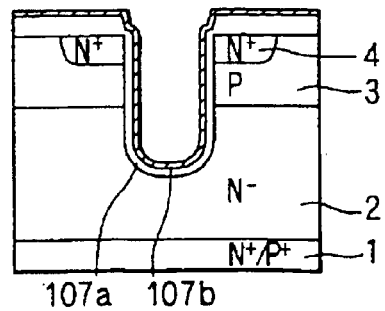
Figure 9H:
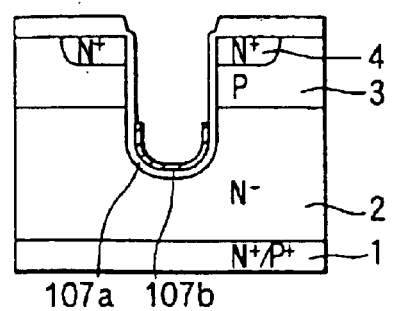

In a step shown in FIG. 9G, the silicon nitride film 107b other than the portion covered with the photo-resist 12 at the bottom portion of the trench 6, i.e., the silicon nitride film 107b disposed on the side wall portion of the trench 6 is removed by dry etching using gas including $CHF_3$ and $O_2$. At that time, the silicon nitride formed disposed on the upper portion of the trench 6 and on the silicon oxide film 11 on the substrate surface is removed simultaneously. Then, in a step shown in FIG. 9H, the photo-resist remaining at the bottom portion of the trench 6 is removed.

Figure 10A:
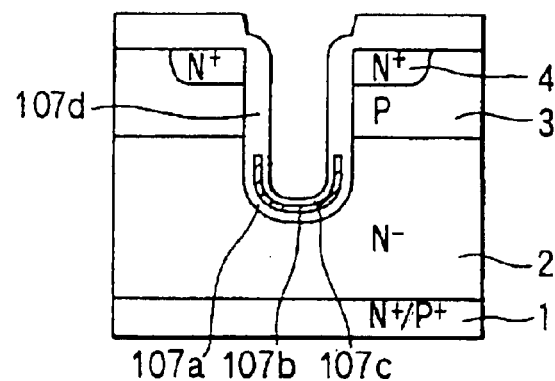

Next, in a step shown in FIG. 10A, for example, thermal oxidation is performed in $H_2O$ or $O_2$ atmosphere at 950° C. The thermal oxidation forms the silicon oxide film 107d that thickens on the side wall portion and the upper portion of the trench 6 with a thickness of about 100 nm. At the bottom portion of the trench 6, the silicon oxide film 107c of several nanometers is formed on the silicon nitride film 107b.

Figure 10B:
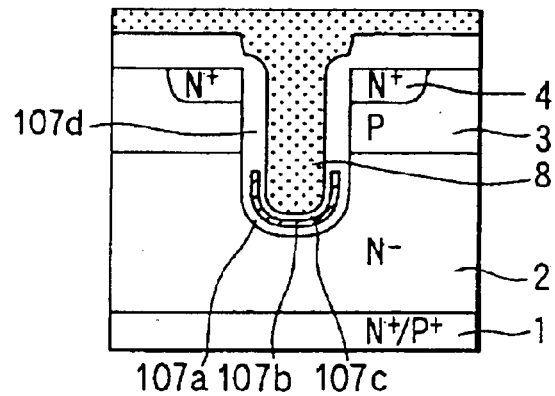
Figure 10C:
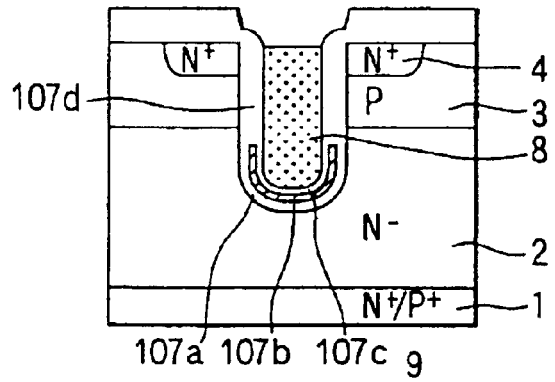

In a step shown in FIG. 10B, doped polycrystalline silicon 8 is formed by an LPCVD method for the gate electrode, thereby filling the trench 6. Successively, the polycrystalline silicon 8 is etched-back to have a desired thickness. In a step shown in FIG. 10C, the polycrystalline silicon 8 is patterned by photo-lithography, thereby forming the gate electrode 8.

Figure 10D:
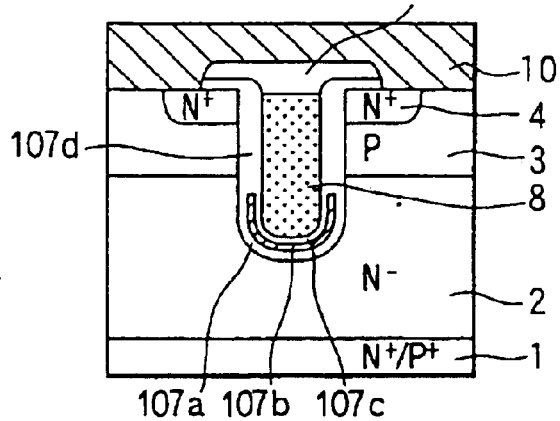

Then, in a step shown in FIG. 10D, the BPSG film 9 is formed as an intermediate insulating film by a plasma enhanced CVD method, the contact holes are formed in the BPSG film 9 by photo-lithography and anisotropic dry etching, and metallic films for the source, gate, and collector electrodes are formed by a sputtering method. Thus, the semiconductor device shown in FIG. 8 is manufactured.

According to the manufacturing method described above, after the silicon oxide film 107a and the silicon nitride film 107b are formed on the inner wall of the trench 6, the portions of the silicon nitride film disposed on the side wall portion and the upper portion of the trench 6 are removed. After that, thermal oxidation is performed to form the silicon oxide film 107c on the silicon nitride film 107b, and to form the silicon oxide film 107d on the side wall portion and the upper portion of the trench 6 where silicon nitride film is removed.

Therefore, the layered film composed of the silicon oxide film 107a, the silicon nitride film 107b, and the silicon oxide film 107c is formed on the bottom portion of the trench 6, and accordingly, a high gate withstand voltage can be attained. Also, because only the silicon oxide film 107d is formed on the side wall portion and the upper portion of the trench 6, variation in threshold voltage can be reduced. Also, the thickness of the silicon oxide film on the upper portion of the trench 6 can be increased by oxidation accelerated by the n$^+$-type layer 4. Because of this, the electric field concentration on the corner portion of the upper portion of the trench 6 can be reduced, and a reduction in the withstand voltage at that portion can be suppressed. Incidentally, the conductive type of each layer in the semiconductor device is not limited to that shown in FIG. 8 and may be inverted from that shown.

Third Embodiment

Figure 21:
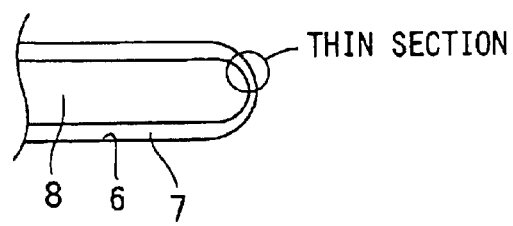
FIG. 21 is a fragmentary plan view showing a longitudinal end of a trench.

In a transistor like that of the first embodiment, the stack of films may be thinner at an end of the trench 6, as shown in FIG. 21, in comparison to the rest of the stack because the end of the trench 6 is rounded. Therefore, improvement in the resistance of the gate-insulating film 7 against electric-field intensity may be limited by the thinner stack located at the end of the trench 6.

In addition, the entrance oxide film 7d (See FIG. 1) is formed by oxidizing a source region 4. The source region 4 is oxidized faster because the source region 4 is heavily doped by an impurity. Although growing speeds of the first and second silicon oxide films 7a, 7c are suppressed by the silicon nitride film 7b, the stack is thickened by the entrance oxide film 7d at the top end. If the top end overlaps with a channel region, which is generated in a surface of a p-type base region 3 in the trench 6, threshold voltage of the proposed device fluctuates.

The thickening of the stack is improved by thinning the silicon oxide films 7d and 7e. However, a nominal thickness of the stack is also reduced, so the durability of the gate-insulating film 7 is lowered. As an alternative, the source region 4 may be thickened enough to avoid having the top end overlap with the channel region.

However, the thermal diffusion distance needs to be increased to make the source region 4 thicker, so the size of the proposed device is enlarged, and the ON voltage of the proposed device is increased. The third embodiment is an attempt to solve these potential problems.

Figure 11A:
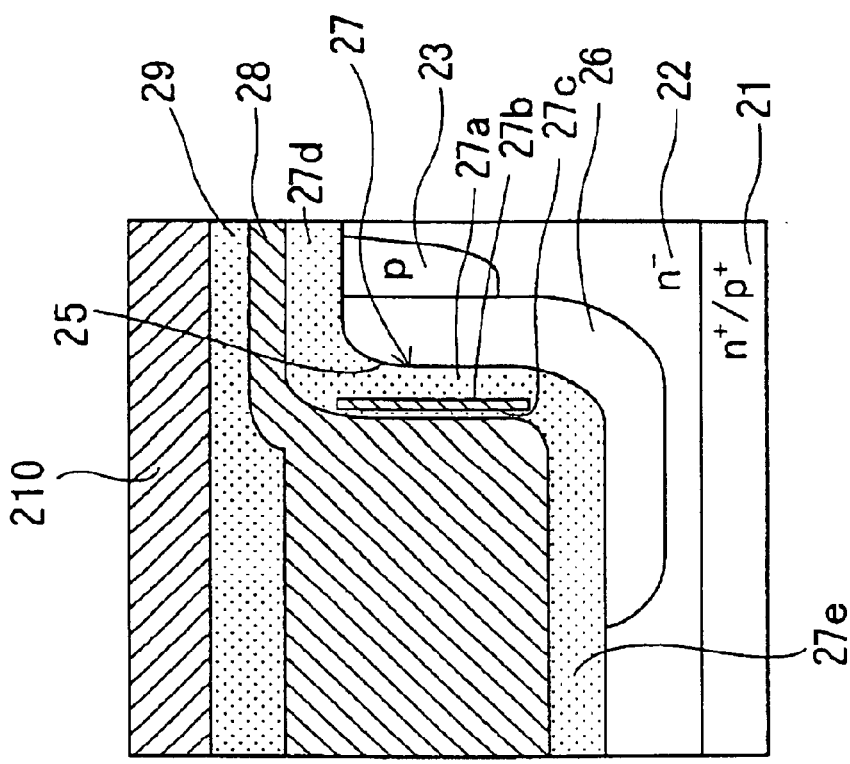
FIG. 11A is a cross-sectional view of a semiconductor device according to the third embodiment of the present invention.
Figure 11B:
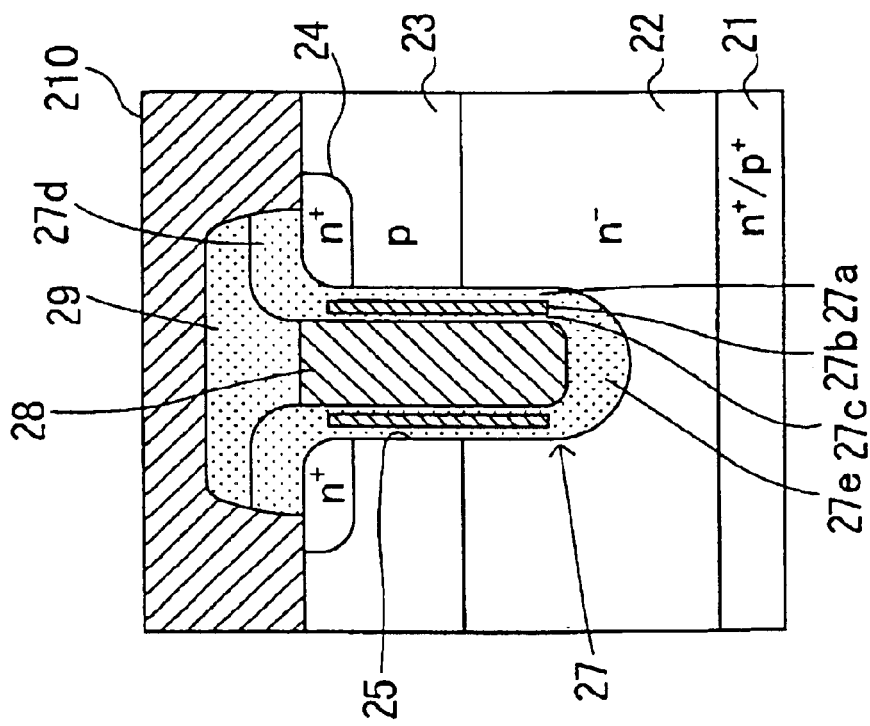
FIG. 11B is a partial side cross-sectional view of a third embodiment seen from a direction that is perpendicular to the view direction of FIG. 11A.

As shown in FIGS. 11A and 11B, a semiconductor device according to the third embodiment has a trench-gate structure, which is applied to a power MOSFET (Metal-Oxide-Silicon Field Effect Transistor) or an IGBT (Insulated Gate Bipolar Transistor). In FIGS. 11A and 11B, an n$^-$-type (first conduction type) drift layer 22 is located on an n$^+$-type or p$^+$-type silicon substrate 21. On a surface of the n$^+$-type drift layer 22, a p-type (second conduction type) base region 23 is located. Near the surface of the p-type base region 23, an n$^+$-type (first conduction type) source region 24 is located. The silicon substrate 21, the drift layer 22, the base region 23, and the source region 24 form a semiconductor substrate. The semiconductor substrate has a trench 25, which extends vertically as viewed in FIG. 11A from a surface of the semiconductor substrate through and the base region 23 and reaches the drift layer 22. The source region 24 is located at the entrance of the trench 25. A channel region is generated in the base region 23 in the vicinity of the trench 25. As shown in FIG. 11B, a heavily doped region 26, which is heavily doped with an impurity, is located in a surface that defines the trench 25, at an end of the trench 25. As shown in FIG. 11B, the heavily doped region 26 extends from the entrance to the bottom of the trench 25, at the end of the trench.

A gate-insulating film 27 is located on the surface defining the trench 25. The gate-insulating film 27 includes entrance and bottom silicon oxide films 27d and 27e, which are located respectively at the entrance and the bottom of the trench 25, and a stack of films formed between the entrance and the bottom. The stack includes a first silicon oxide film 27a, a silicon nitride film 27b, and a second silicon oxide film 27c. An upper end of the film 27b in the vertical direction of FIG. 1A is located on a surface of the source region 24 A lower end of the film 27b is located on a surface of the drift layer 22. The first and second silicon oxide films 27d, 27e are thicker than the stack of films. As shown in FIG. 11B, the first silicon oxide film 27a is thicker on a surface of the heavily doped region 26 than the rest of the first silicon oxide film 27a. Namely, the stack is thicker at the longitudinal end of the trench 25 than the rest of the stack.

A gate electrode 28 made of doped poly crystalline silicon is located on the gate-insulating film 27 in the trench 25. The gate electrode 28, the base region 23, and the source region 24 are covered by an interlayer insulating film 29, which is made of BPSG (boron phosphorus silicate glass). Through a contact hole made in the interlayer insulating film 29, a source electrode 210 is electrically connected to the base region 23 and the source region 24, and other electrodes (not illustrated) are respectively connected to the gate electrode 28 and a drain.

In the device in FIGS. 11A and 11B, the stack of films is thicker at the longitudinal end than at the rest of the stack. Therefore, the resistance of the gate-insulating film 27 against electric-field intensity is improved in comparison with the device of FIG. 1, so the breakdown voltage of the device of FIGS. 11A and 11B is increased without increasing the ON voltage.

Figure 12A:
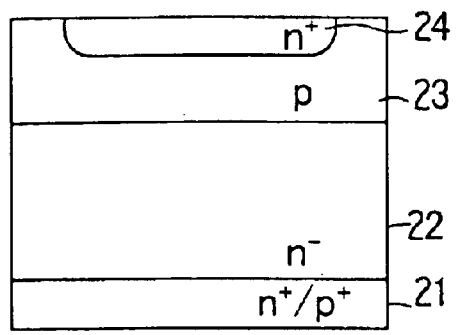
FIGS. 12A to 12C are cross-sectional views showing first steps of a process for manufacturing the semiconductor device according to the third embodiment.

The device in FIGS. 11A and 11B is manufactured through a process including steps shown in FIGS. 12A to 14D. As shown in FIGS. 12A and 12D, the n$^-$-type drift layer 22 is formed on the n$^+$-type or p$^+$-type silicon substrate 21. Then, the p-type base region 23, the thickness of which ranges between 2 and 3 micrometers, is formed in the surface of the n$^-$-type drift layer 22 using ion implantation and thermal diffusion. The n$^+$-type source region 24, which has a thickness of 0.5 micrometers, is formed in the surface of the p-type base region 23. A silicon oxide film 211, which is deposited on the substrate 21, is defined by photolithography to form an opening in the silicon oxide film 211. Then, the trench 25, which has a depth ranging between 4 and 6 micrometers, is formed by anisotropic etching using the silicon oxide film 211 as a mask, as shown in FIGS. 12B and 12E.

Figure 12D:
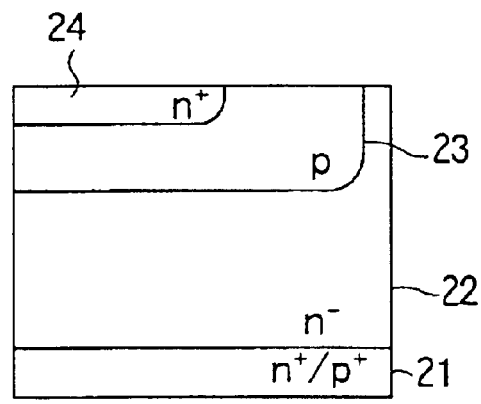
FIGS. 12D to 12F are partial side cross-sectional views showing first steps seen from directions perpendicular to the view directions of the corresponding views of FIGS. 12A to 12C, respectively.
Figure 12B:
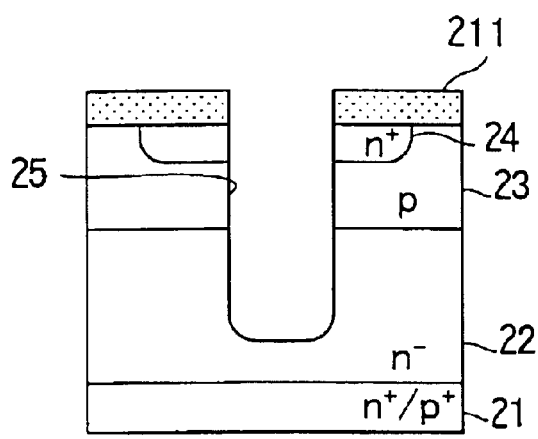
Figure 12E:
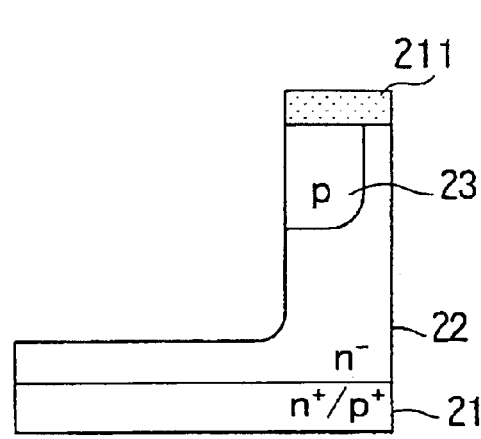
Figure 12C:
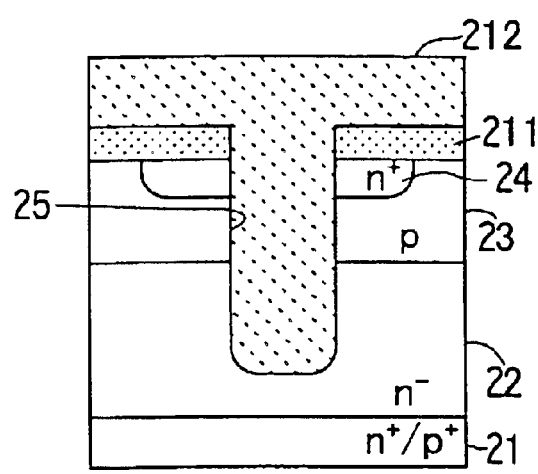
Figure 12F:
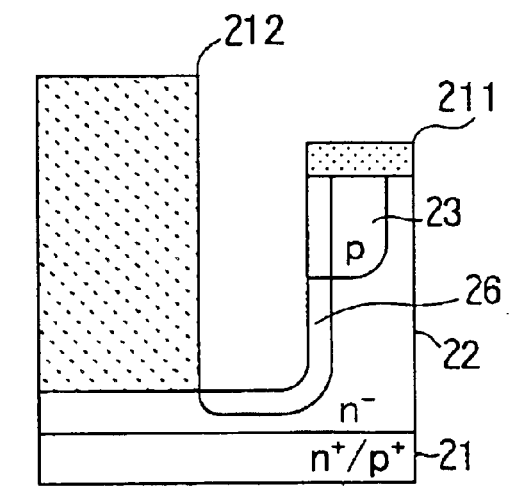

As shown in FIGS. 12C and 12F, after the damage due to the anisotropic etching is cured, a masking material 212 such as photoresist is deposited on the substrate 21 and defined by photolithography to unmask the longitudinal end of the trench 25. Then, the heavily doped region 26 is formed by off-axis ion implantation using the masking material 212 as a mask. After the masking material 212 is removed, the trench surface, which defines the trench 25, is isotropically etched by chemical dry etching using $CF_4$ and $O_2$ gasses by about 0.1 micrometers. Then, a sacrificial silicon oxide film, which has a thickness of about 100 nanometers, is formed by thermal oxidization in $H_2O$ or $O_2$ atmosphere. The sacrificial oxide film is removed by wet etching using dilute fluoric acid. The silicon oxide film 211 may be simultaneously removed in this step.

Figure 13A:
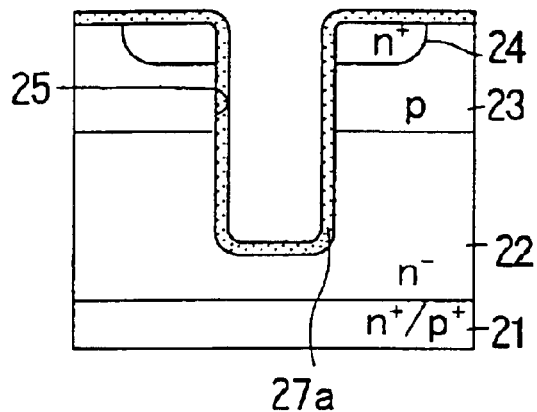
FIGS. 13A to 13C are cross-sectional views showing intermediate steps of the process following FIG. 12C.
Figure 13D:
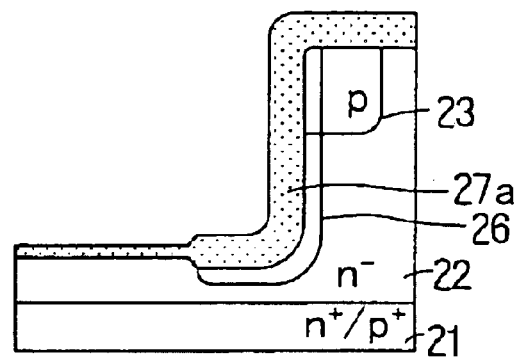
FIGS. 13D to 13F are partial side cross-sectional views seen from directions perpendicular to the view directions of the corresponding FIGS. 13A to 13C, respectively, to show the intermediate steps following FIG. 12F.
Figure 13B:
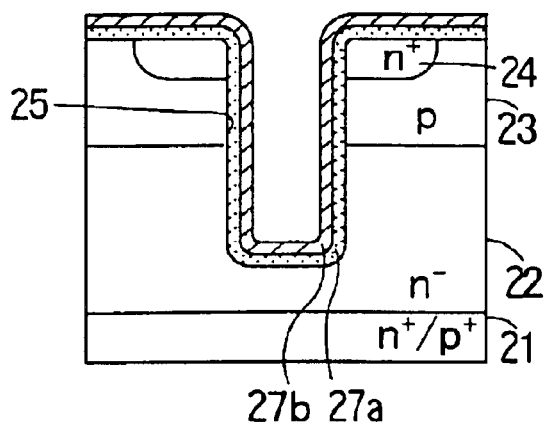
Figure 13E:
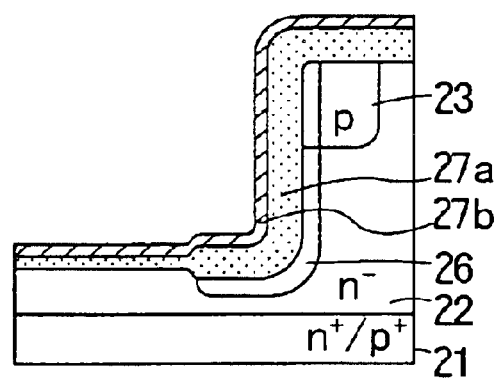
Figure 13C:
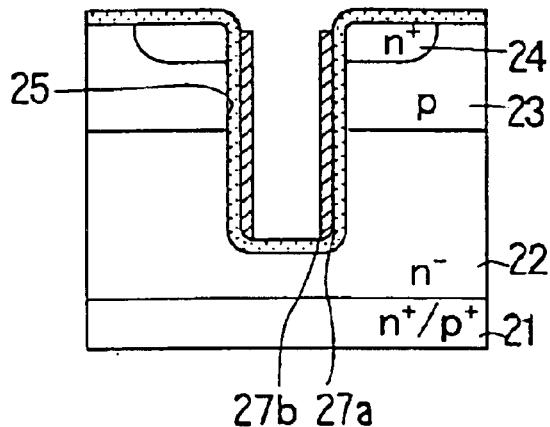
Figure 13F:
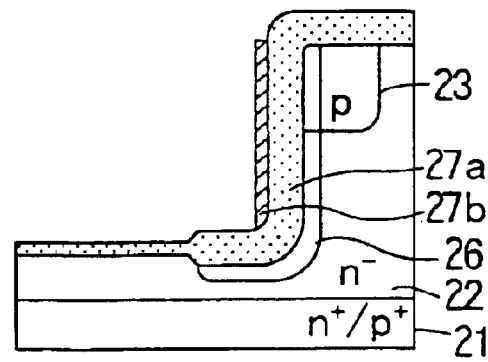
Figure 14A:
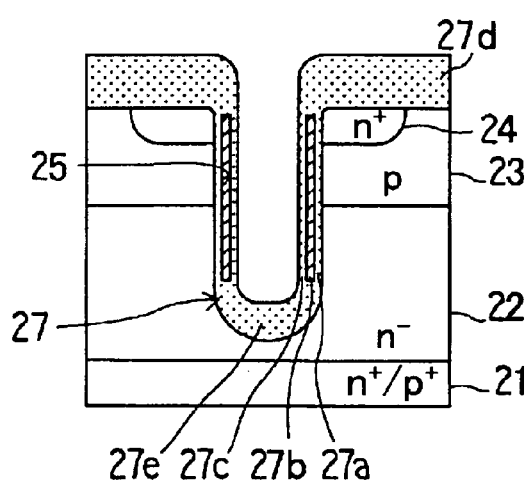
FIGS. 14A and 14B are cross-sectional views showing final steps of the process following FIG. 13C.
Figure 14B:
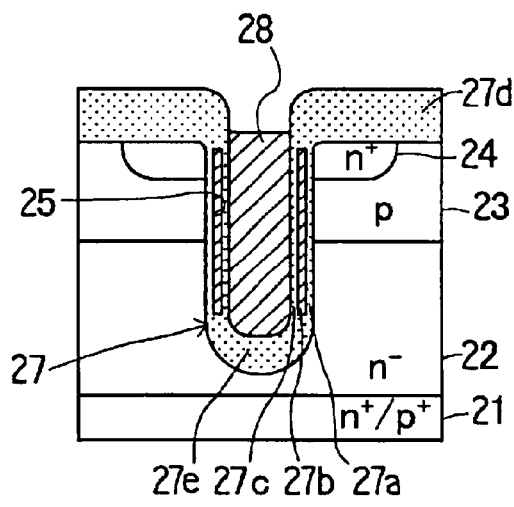
Figure 14C:
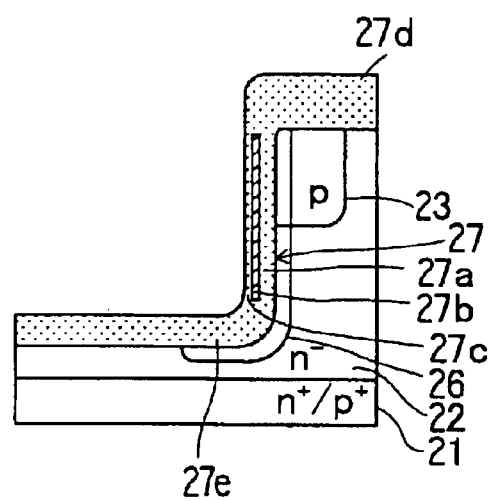
FIGS. 14C and 14D are partial cross-sectional views of the final steps following FIG. 13F seen from directions perpendicular to the view directions of corresponding FIGS. 14A and 14B, respectively.
Figure 14D:
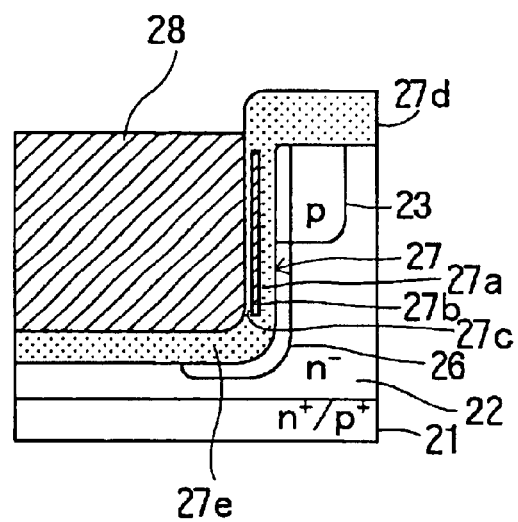

Afterward, the first silicon oxide film 27a, which has a thickness of about 100 nanometers, is formed by thermal oxidization in H₂O or O₂ atmosphere, as shown in FIGS. 13A and 13D. The first silicon oxide film 27a is thicker at the end of the trench 25 than the rest of the first silicon oxide film 27a, because the heavily doped region 26 is oxidized relatively faster, as shown in FIG. 13D. Then, the silicon nitride film 27b, which has a thickness ranging between 10 and 30 nanometers, is deposited on the first silicon oxide film 27a by LPCVD, as shown in FIGS. 13B and 13E. The silicon nitride film 27b is anisotropically etched by chemical dry etching using etching gas containing CHF₃ and O₂ to leave the film 27b only on sidewalls of the trench surface, as shown in FIGS. 13C and 13F. Subsequently, the second silicon oxide film 27c, the thickness of which is greater than 50 angstroms, is formed on the silicon nitride film 27b by thermal oxidization in an H₂O or O₂ atmosphere at 950 degrees Celsius, as shown in FIGS. 14A and 14C. The entrance and bottom silicon oxide films 27d, 27e, which have a thickness of about 200 nanometers, are formed by this oxidization at the entrance and bottom of the trench 25, where the silicon nitride film 27b is removed. A doped polycrystalline silicon film 213 is deposited by LPCVD to fill up the trench 25. Then, the doped polycrystalline silicon film 213 is defined to form the gate electrode 28 after the doped polycrystalline silicon film 213 is etched back to provide a predetermined thickness.

Although not illustrated, the interlayer insulating film 29 is formed by plasma CVD, and the contact hole extending through the film 29 is formed, and the source electrode 210 is formed by sputtering to complete the semiconductor device shown in FIGS. 11A and 11B.

Fourth Embodiment

As shown in FIG. 15B, the device according to the fourth embodiment has no heavily doped region 26 shown in FIG. 11B. Instead, the gate-insulating film 27 has a longitudinal end silicon oxide film 27f (27a, 27c), which is thicker than the stack of films, at the longitudinal end of the trench 25. In this way, this device has the same effect as the device in the third embodiment.

The semiconductor device according to the fourth embodiment is manufactured with a process including steps shown in FIGS. 16A to 18D. The same steps as in FIGS. 12A, 12B, 12D, and 12E are carried out as shown in FIGS. 16A, 16B, 16D, and 16E. Afterward, as shown in FIGS. 16C and 16F, which show the same steps as in FIGS. 13A and 13D, the first silicon oxide film 27a, which has a thickness of about 100 nanometers, is formed. Then, as shown in FIGS. 17A and 17D, which show the same steps as in FIGS. 13B and 13E, the silicon nitride film 27b, which has a thickness ranging between 10 and 30 nanometers, is deposited on the first silicon oxide film 27a. As shown in FIGS. 17B and 17E, which show the same steps as in FIGS. 13C and 13F, the silicon nitride film 27b is etched to leave the silicon nitride film 27b only on the sidewalls of the trench surface.

Figure 17A:
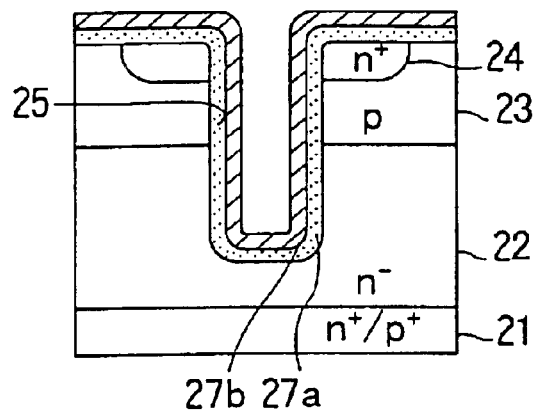
FIGS. 17A to 17C are cross-sectional views showing intermediate steps of the process following FIG. 16C.
Figure 17D:
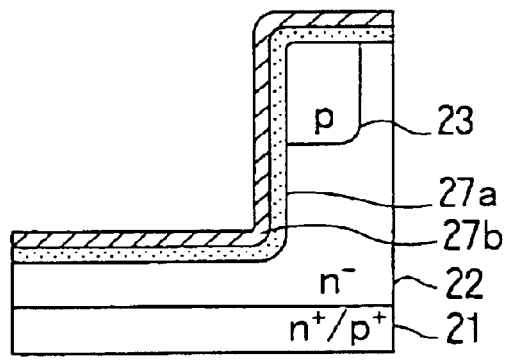
FIGS. 17D to 17F are side cross-sectional views of intermediate steps following FIG. 16F as seen from directions perpendicular to the view directions of corresponding FIGS. 17A to 17C, respectively.
Figure 17B:
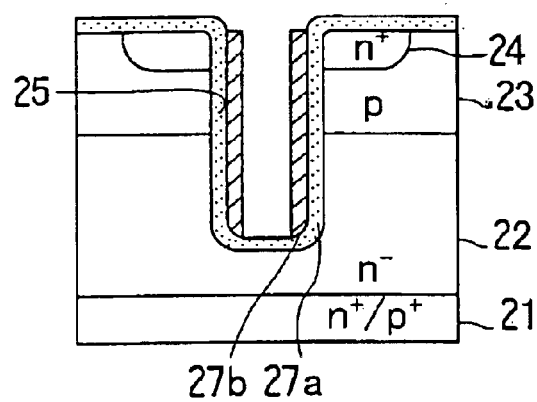
Figure 17E:
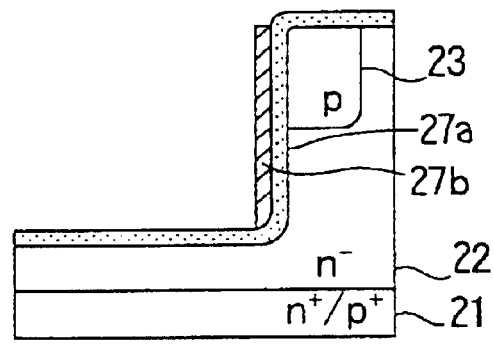
Figure 17C:
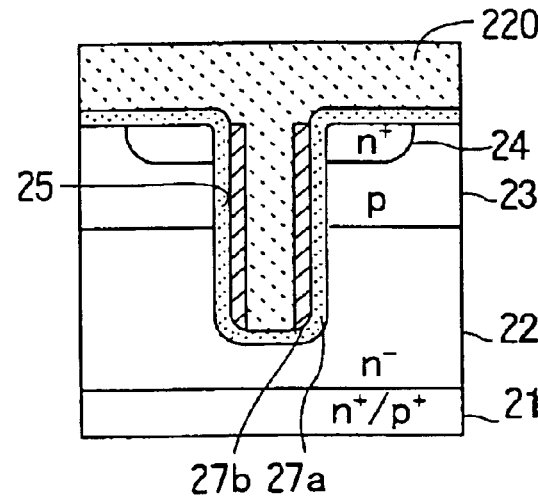
Figure 17F:
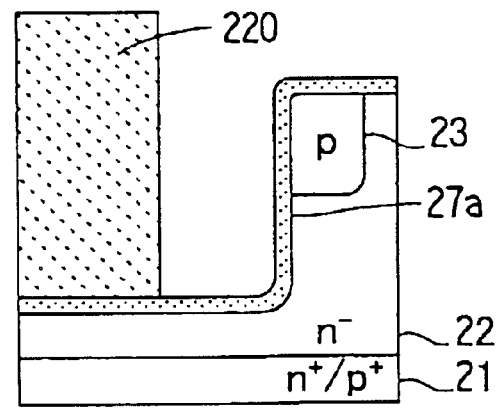
Figure 18A:
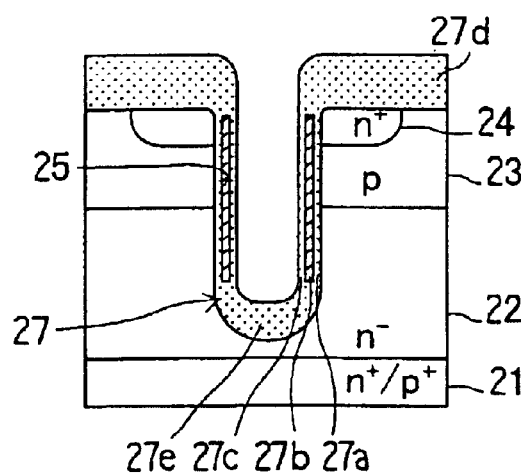
FIGS. 18A and 18B are cross-sectional views showing final steps of the process following FIG. 17C.
Figure 18B:
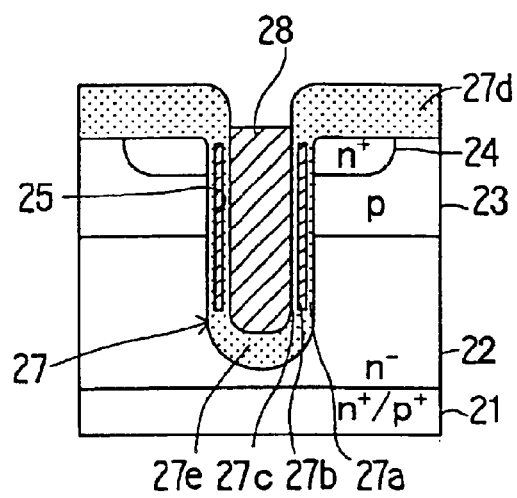
Figure 18C:
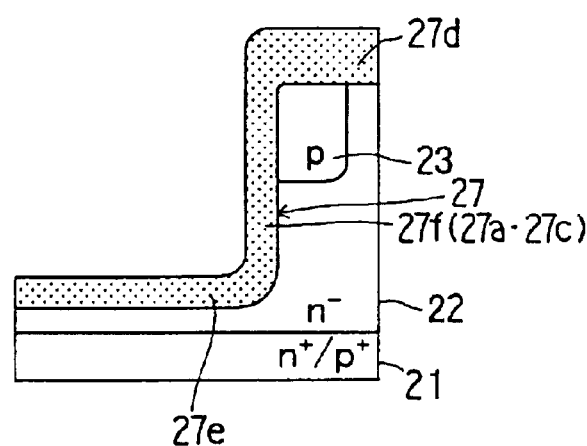
FIGS. 18C and 18D are partial side cross-sectional views showing final steps following FIG. 17F as seen from directions perpendicular to the view directions of FIGS. 18A and 18B, respectively.
Figure 18D:
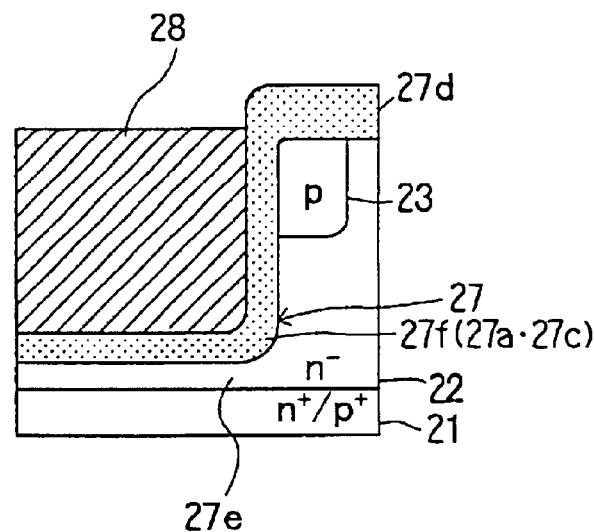

As shown in FIGS. 17C and 17F, which include the same photolithography step shown in FIGS. 12C and 12F, a masking material 220 such as photoresist is deposited on the substrate 21 and defined by photolithography to unmask the longitudinal end of the trench 25. Then, the unmasked silicon nitride film 27b at the longitudinal end is removed by isotropic dry or wet etching, as shown in FIG. 17F. After the masking material 220 is removed, the surface that defines the trench 25 is oxidized, as shown in FIGS. 18A and 18C, which show the same steps shown in FIGS. 14A and 14C. By this oxidization, the second silicon oxide film 27c is formed on the silicon nitride film 27b. Simultaneously, the entrance silicon oxide film 27d, the bottom silicon oxide film 27e, and the longitudinal end silicon oxide film 27f (27a, 27c), which have a thickness of about 200 nanometers, are formed respectively at the entrance, the bottom and the longitudinal end of the trench 25, where the silicon nitride film 27b is removed. Then, the gate electrode 28 is formed, as shown in FIGS. 18B and 18D, which show the same steps as in FIGS. 14B and 14D.

Although not illustrated, after the gate electrode 28 is formed, the interlayer insulating film 29 is deposited. Then, a contact hole is formed in the interlayer insulating film 29 by photolithography and anisotropic etching, and the source electrode 210 is formed by sputtering to complete the semiconductor device shown in FIGS. 15A and 15B.

Fifth Embodiment

Figure 19:
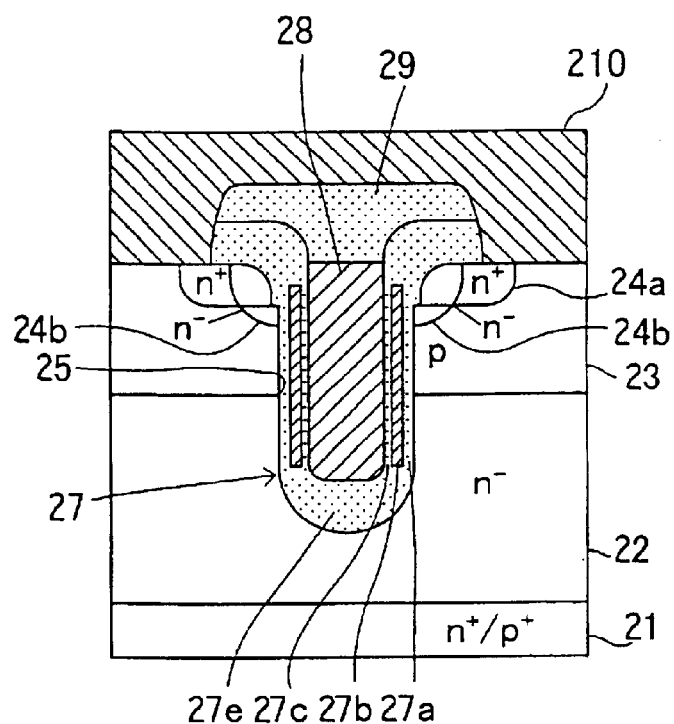
FIG. 19 is a cross-sectional view of a semiconductor device according to the fifth embodiment of the present invention.
Figure 20:
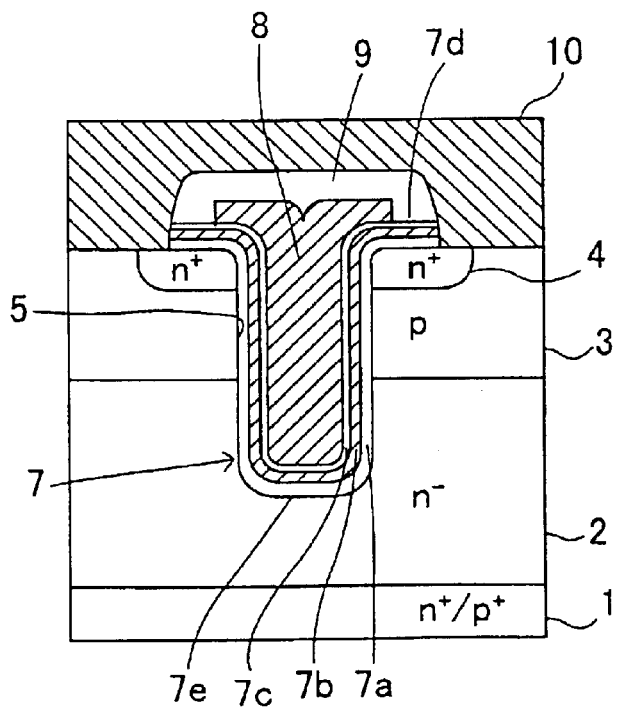
FIG. 20 is a cross-sectional view of a related semiconductor device.

As shown in FIG. 19, the n⁺-type source region 24 includes a first region 24a and a second region 24b. The first region 24a has a high enough impurity concentration to increase the oxidization speed of first region 24a. The impurity concentration of the second region 24b is lower than that of the first region 24a so that the oxidization speed of the second region 24b is not increased. The first region 24a has a predetermined depth from the surface of the substrate. The depth of the second region 24b is greater than that of the first region 24a. The second region 24b is located at the entrance of the trench 25 to separate the first region 24a from the channel region, which is generated in the base region 23 in the vicinity of the trench 25. The thickness of the gate-insulating film 27 on the channel region is not affected by the thick silicon oxide film formed on the first region 24a. Therefore, the threshold voltage of the semiconductor device of FIG. 19 is stable.

Figure 16A:
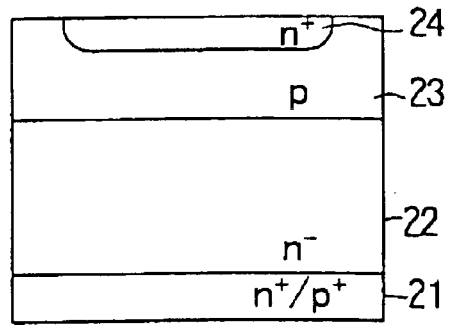
FIGS. 16A to 16C are cross-sectional views showing first steps of a process for manufacturing the semiconductor device according to the fourth embodiment.
Figure 16D:
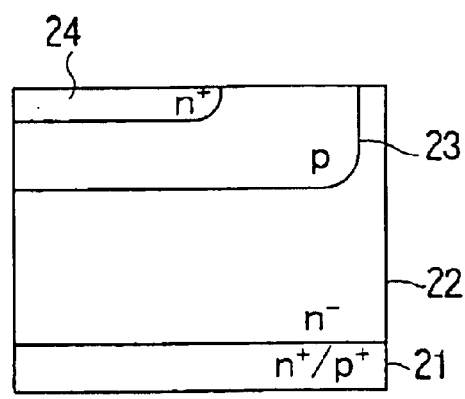
FIGS. 16D to 16F are partial side cross-sectional views showing early steps as seen from view directions perpendicular to the view directions of corresponding FIGS. 16A to 16C, respectively.
Figure 16B:
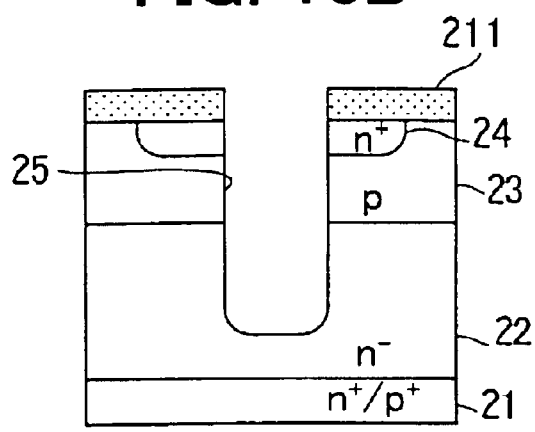
Figure 16E:
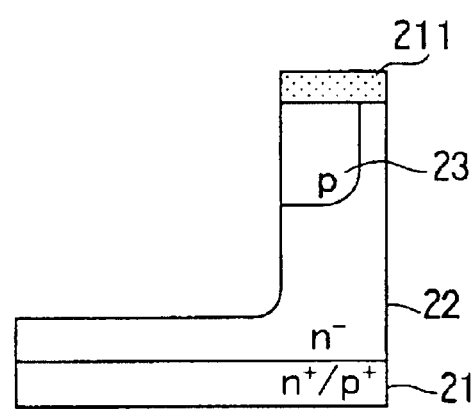
Figure 16C:
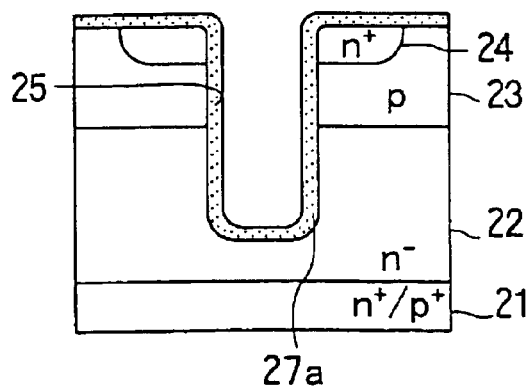
Figure 16F:
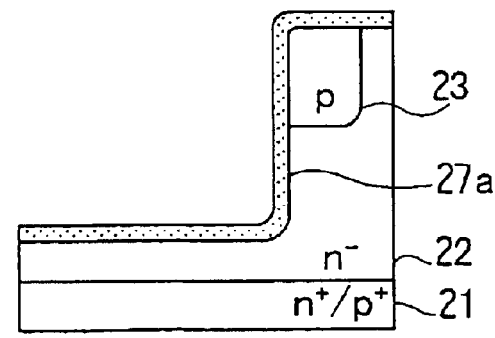

The first region 24a and the second region 24b are manufactured respectively by implanting n-type impurity ions into the base region 23 with a high concentration and a low concentration at the steps shown in FIGS. 12A and 12D or at the steps shown in FIGS. 16A and 16D, in which the n⁺-type source region 24 is formed.

Modifications

In the semiconductor device of FIGS. 11A and 11B, the heavily doped region 26 is formed after curing the damage due to the dry etching for forming the trench 25. However, the heavily doped region 26 may be formed at any step after forming the trench 25 and before forming the fist silicon oxide film 27a. Moreover, the heavily doped region 26 may be formed before forming the trench 25 as long as the heavily doped region 26 has an appropriate impurity concentration.

In the semiconductor device of FIG. 19, the first region 24a, the second region 24b, and the trench 25 can be formed in this order. However, the order is flexible. For example, they may be formed in the following order: the second region 24b, the first region 24a, and the trench 25. Also, they may be formed in the following order: the trench 25, the first region 24a, and the second region 24b. In addition, the p-type base region 23 may be formed after forming the trench 25. For example, the trench 25, the p-type base region 23, the first region 24a, and the second region 24b may be formed in this order. In the latter example as well, it is possible to change the order of the first region 24a and the second region 24b.

The devices in FIGS. 11A, 15A, and 19 are n-channel transistors. However, the present invention may be used in a p-channel transistor.

While the present invention has been shown and described with reference to the foregoing preferred embodiments, it will be apparent to those skilled in the art that changes in form and detail may be made without departing from the scope of the invention as defined in the appended claims.

What is claimed is:

1. A semiconductor device comprising:
   a semiconductor substrate having a surface in which a trench is formed, wherein the trench has a wall;
   a heavily doped region, which is formed in the wall at an end of the trench, wherein the heavily doped region is doped with an impurity to increase the oxidization speed of the heavily doped region;
   a stack of films formed on the wall, wherein the stack includes:
   a first silicon oxide film, wherein the thickness of the first silicon oxide film is greater at the end of the trench than elsewhere;
   a silicon nitride film; and
   a second silicon oxide film, and
   a gate electrode formed on the films
   an entrance silicon oxide film, the thickness of which is greater than that of the stack, wherein the entrance silicon oxide film is located at an entrance of the trench; and
   a bottom film, the thickness of which is greater than that of the stack, wherein the bottom film is located at a bottom of the trench.

2. The semiconductor device of claim 1, wherein the substrate includes:
   a source region of a first conduction type;
   a base region of a second conduction type; and
   a drift region of first conduction type, wherein the source region, the base region, and the drift region are located in this order from the surface and the trench extends perpendicularly from the surface to the drift region through the source region and the base region; and
   a channel region in the base region adjacent to the trench.

3. The semiconductor device of claim 2, wherein the source region includes:
   a first region, which has a predetermined impurity concentration and a predetermined depth; and
   a second region, which has an impurity concentration that is lower than the first region, wherein the depth of the second region is greater than that of the first region, and the second region is located between the first region and the trench.

4. A semiconductor device comprising:
   a semiconductor substrate having a surface in which a trench is formed, wherein the trench has a wall and an end;
   a stack of insulating films formed on the wall, wherein the stack includes:
   a first silicon oxide film;
   a silicon nitride film, which is located on the first silicon oxide film; and
   a second silicon oxide film, which is located on the silicon nitride film; and
   an end insulating film formed at the end of the trench, wherein the end insulating film includes only the first and second silicon oxide films, and the thickness of the end insulating film is greater than that of the stack, and
   a gate electrode formed on the stack and on the end insulating film
   an entrance silicon oxide film, the thickness of which is greater than that of the stack, wherein the entrance silicon oxide film is located at an entrance of the trench; and
   a bottom entrance film, the thickness of which is greater than that of the stack, wherein the bottom entrance film is located at a bottom of the trench.

5. The semiconductor device of claim 4, wherein the substrate includes:
   a source region of a first conduction type;
   a base region of a second conduction type; and
   a drift region of first conduction type, wherein the source region, the base region, and the drift region are located in this order from the surface and the trench extends perpendicularly from the surface to the drift region through the source region and the base region; and
   a channel region in the base region adjacent to the trench.

6. The semiconductor device of claim 5, wherein the source region includes:
   a first region, which has a predetermined impurity concentration and a predetermined depth; and
   a second region, which has an impurity concentration that is lower than the first region, wherein the depth of the second region is greater than that of the first region, and the second region is located between the first region and the trench.

7. A method for manufacturing a semiconductor device, in which a gate-insulating film is located on a wall of a trench formed in a semiconductor substrate, wherein a gate electrode is located on the gate-insulating film, the method comprising:
   forming a heavily doped region in the wall at an end of the trench by doping an impurity with a concentration such that the oxidization speed of the doped region is increased;
   oxidizing the trench surface to form a first silicon oxide film, which is thicker at the heavily doped region than elsewhere;
   forming a silicon nitride film on the first silicon oxide film; and
   oxidizing the trench surface to form a second silicon oxide film on the silicon nitride film; and
   removing the silicon nitride film from an entrance and a bottom of the trench to form a silicon oxide film that is thicker than the stack.

8. The method of claim 7 further comprising:
   forming a drift region of a first conduction type;
   forming a base region of a second conduction type;
   forming a source region of the first conduction type by forming a first region, which has a predetermined impurity concentration and a predetermined depth, and a second region, which has a lower impurity concentration and a greater depth than the first region; and
   forming the trench to extend perpendicularly from the surface of the substrate to the drift region through the source region and the base region, such that the second region is located between the first region and the trench.

9. A method for manufacturing a semiconductor device, in which a gate-insulating film is located on a wall of a trench formed in a semiconductor substrate, wherein a gate electrode is located on the gate-insulating film, the method comprising:
   forming a first silicon oxide film on the wall;
   forming a silicon nitride film on the first silicon oxide film;

removing the silicon nitride film at an end of the trench;

oxidizing the wall to form a second silicon oxide film on the silicon nitride film and to thicken the first silicon oxide film at the end of the trench; and removing the silicon nitride film from an entrance and a bottom of the trench to form a silicon oxide film that is thicker than the stack.

10. The method of claim 9 further comprising:

forming a drift region of a first conduction type;

forming a base region of a second conduction type;

forming a source region of the first conduction type by forming a first region, which has a predetermined impurity concentration and a predetermined depth, and a second region, which has a lower impurity concentration and a greater depth than the first region; and forming the trench to extend perpendicularly from the surface of the substrate to the drift region through the source region and the base region, such that the second region is located between the first region and the trench.

* * * * *